US012801177B2

(12) United States Patent
Park et al.

(10) Patent No.: US 12,801,177 B2
(45) Date of Patent: Nov. 17, 2026

(54) SYSTEM ON CHIP AND OPERATING METHOD THEREOF FOR SELECTIVELY GATING CLOCK SIGNAL IN LOW UTILIZATION

(71) Applicant: Samsung Electronics Co., Ltd., Suwon-si (KR)

(72) Inventors: Jun Hyun Park, Suwon-si (KR); Kyurae Lee, Suwon-si (KR); Jangpyo Lee, Suwon-si (KR); Wooil Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/933,254

(22) Filed: Oct. 31, 2024

(65) Prior Publication Data

US 2025/0278110 A1 Sep. 4, 2025

(30) Foreign Application Priority Data

Mar. 4, 2024 (KR) ........................ 10-2024-0030908

(51) Int. Cl.
*G06F 1/08* (2006.01)
*G06F 1/12* (2006.01)
*H03K 19/20* (2006.01)

(52) U.S. Cl.
CPC .................. *G06F 1/08* (2013.01); *G06F 1/12* (2013.01); *H03K 19/20* (2013.01)

(58) Field of Classification Search
CPC ........................................................ G06F 1/08
See application file for complete search history.

(56) References Cited

U.S. PATENT DOCUMENTS 8,058,905 B1 11/2011 Klein et al.
9,310,867 B2 4/2016 Brinks et al.
9,384,855 B2 7/2016 Lee et al.
9,984,019 B2 5/2018 Yoo et al.
10,209,734 B2 2/2019 Lee et al.
11,644,504 B2 * 5/2023 Dondini ......... G01R 31/318552 714/731
2011/0202788 A1 8/2011 Hesse et al.
(Continued)

OTHER PUBLICATIONS

Kyurae Lee et al. "Node Based Clock Gating: Reducing NoC Power," 2023 60th ACM/IEEE Design Automation Conference (DAC), Jul. 9-13, 2023.

*Primary Examiner* — Phil K Nguyen
(74) *Attorney, Agent, or Firm* — Fish & Richardson P.C.

(57) ABSTRACT

A system on chip includes interface nodes and clock gating cells. A first interface node outputs first and second control signals having a first bit value based on a first packet, outputs the first packet based on a first clock signal, and outputs the first and second control signals having a second bit value based on first packet transmission. A second interface node outputs a third control signal in response to handshaking the first interface node, and receives the first packet from the first interface node based on a second clock signal. A first clock gating cell outputs the first clock signal based on an external clock signal and gates the first clock signal based on the first control signal. A second clock gating cell outputs the second clock signal based on the external clock signal and gates the second clock signal based on the second and third control signals.

8 Claims, 17 Drawing Sheets

(56) References Cited

U.S. PATENT DOCUMENTS

| | | | | |
|---|---|---|---|---|
| 2011/0216861 | A1* | 9/2011 | Melzer | G06F 1/3237 375/354 |
| 2016/0094337 | A1* | 3/2016 | Choi | H04J 3/0685 375/356 |
| 2017/0214480 | A1* | 7/2017 | Kim | G06F 1/06 |
| 2018/0004278 | A1* | 1/2018 | Lim | G06F 1/3287 |
| 2019/0214989 | A1* | 7/2019 | Shon | G06F 1/3287 |
| 2019/0278357 | A1* | 9/2019 | Lee | G06F 1/3234 |
| 2022/0413544 | A1* | 12/2022 | Han | G06F 1/10 |
| 2023/0104271 | A1 | 4/2023 | Yoo et al. | |
| 2023/0206368 | A1 | 6/2023 | Viswanathan et al. | |
| 2023/0266899 | A1* | 8/2023 | Sundararajan | G11C 5/147 711/154 |

* cited by examiner

SYSTEM ON CHIP AND OPERATING METHOD THEREOF FOR SELECTIVELY GATING CLOCK SIGNAL IN LOW UTILIZATION

CROSS-REFERENCE TO RELATED APPLICATION

This application is based on and claims priority under 35 U.S.C. § 119 to Korean Patent Application No. 10-2024-0030908, filed on Mar. 4, 2024, in the Korean Intellectual Property Office, the disclosure of which is incorporated by reference herein in its entirety.

BACKGROUND

The inventive concepts relate to electronic devices, and specifically, to systems on chip and operating methods thereof, for selectively gating a clock signal at relatively low utilization.

The system on chip is a system in which various functional blocks such as a central processing unit, a memory, an interface, a digital signal processing circuit, and an analog signal processing circuit are integrated into one integrated circuit. Systems on chips are developing into more complex systems that include various functions such as graphics processing and confidentiality protection. Various functional blocks integrated into a system on chip may be connected to each other in the form of a master-slave. A master transmits a request to a slave, the slave transmits, to the master, a response according to the request, and a signal path may be formed between the master and the slave.

As the integration of the system on chip increases and the number of functional blocks mounted on the system on chip increases, the number of signal paths between the master and slave increases, and power consumption increases as the number of signal paths increases. Meanwhile, as the number of masters and the number of slaves increases, interconnects have been added to the system on chip to route traffic between masters and slaves, and power consumption increased further as the signal path became more complex. In order to reduce power consumption, clock gating technology for gating clock signals is being developed for some functional blocks that are not involved in information exchange in an environment where information exchange is relatively small. Conventional clock gating technology gates clock signals in units of signal paths formed between masters, interconnects, and slaves. Despite some functional blocks not involved in information exchange on non-gated signal paths, the clock signal is unnecessarily supplied to that functional block, and there is a problem of low efficiency. Accordingly, fine clock gating technology is required in units smaller than the unit of the signal path.

SUMMARY

Some example embodiments of the inventive concepts provide a system on chip and an operating method thereof for efficiently gating a clock signal to be provided to a node having a specific state at a relatively low utilization.

According to some example embodiments of the inventive concepts, a system on chip may include a first interface node configured to output a first clock control signal and a second clock control signal each having a first bit value, based on a first packet received from a first semiconductor Intellectual Property (IP), output the first packet, based on a first clock signal, and output the first clock control signal and the second clock control signal each having a second bit value, based on a determination that transmission of the first packet from the first interface node is completed. The system on chip may include a second interface node configured to output a third clock control signal having the first bit value in response to handshaking with the first interface node, and receive the first packet from the first interface node, based on a second clock signal. The system on chip may include a first clock gating cell configured to output the first clock signal, based on an external clock signal received from an external signal source, the external signal source external to the first clock gating cell, and gate the first clock signal, based on the first clock control signal. The system on chip may include a second clock gating cell configured to output the second clock signal, based on the external clock signal, and gate the second clock signal, based on the second clock control signal and the third clock control signal.

In addition, according to some example embodiments of the inventive concepts, a system on chip may include at least one master interface node configured to transmit a packet to and receive the packet from at least one master, based on a first clock signal, and output a first control signal and a second control signal, based on the packet. The system on chip may include at least one slave interface node configured to transmit the packet to and receive the packet from at least one slave, based on a second clock signal, and output the first control signal and a third control signal, based on the packet. The system on chip may include a switching interface node configured to transmit the packet according to a signal path between the at least one master interface node and the at least one slave interface node, based on a third clock signal, and output the first control signal, the second control signal, and the third control signal, based on the packet. The system on chip may include a plurality of clock gating cells configured to gate the first clock signal, based on the first control signal and the third control signal, gate the third clock signal, based on the first control signal, the second control signal, and the third control signal, and gate the second clock signal, based on the first control signal and the second control signal.

In addition, according to some example embodiments of the inventive concepts, an operating method of a system on chip may include activating a first clock signal provided to a first interface node and activating a second clock signal provided to a second interface node, based on an address of a first request delivered to the first interface node, wherein the second interface node communicates with the first interface node; transmitting the first request from the first interface node to the second interface node, based on the first clock signal and the second clock signal; deactivating the first clock signal and activating a third clock signal provided to a third interface node communicating with the second interface node, based on the first request being transmitted to the second interface node; transmitting the first request from the second interface node to the third interface node, based on the second clock signal and the third clock signal; and deactivating the second clock signal, based on the first request transmitted to the third interface node.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

Figure 1:
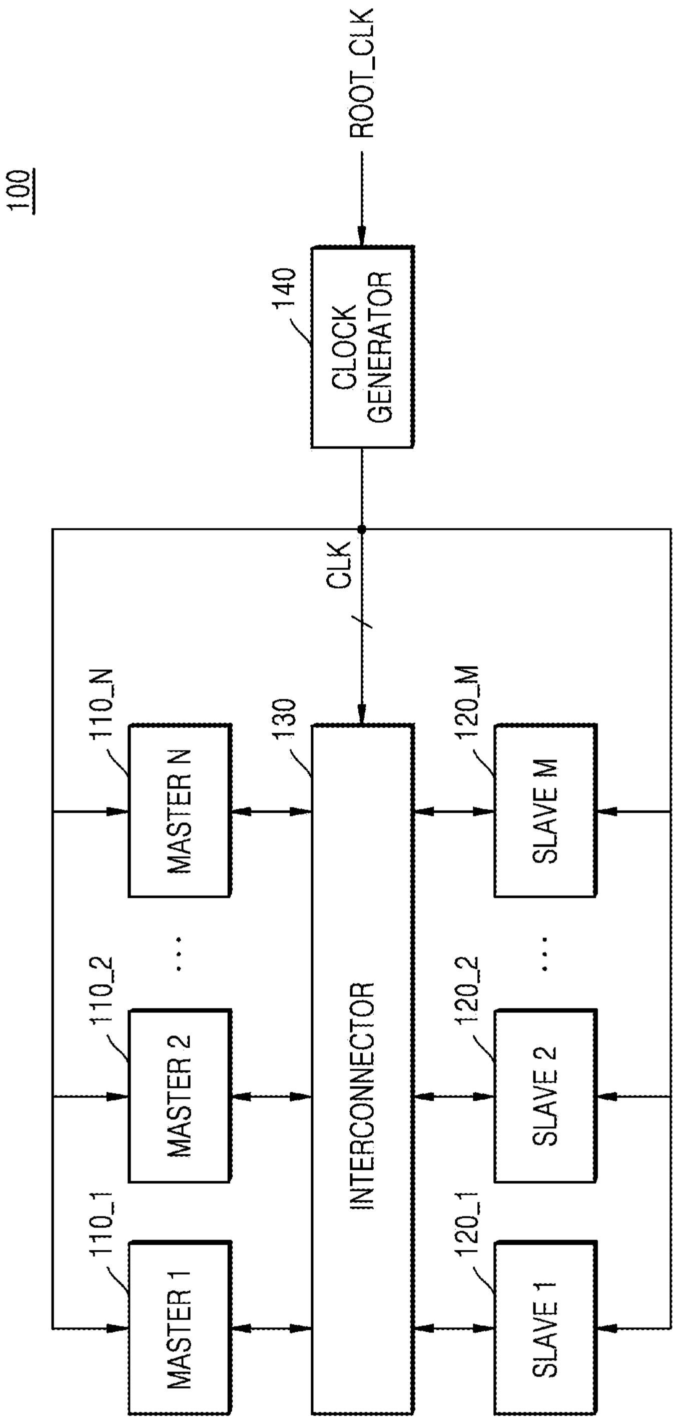
FIG. 1 is a block diagram of a system on chip according to some example embodiments of the present inventive concepts.

FIG. 1 is a block diagram of a system on chip 100 according to some example embodiments of the present inventive concepts.

Referring to FIG. 1, a system on chip 100 may mean a computer system or an electronic system in which various semiconductor intellectual properties (IPs) (or functional blocks) such as a central processing unit, a memory, an interface, a digital signal processing circuit, and an analog signal processing circuit are integrated into one semiconductor integrated circuit. Various semiconductor IPs integrated into the system on chip 100 may be connected to each other in a master-slave form. The system on chip 100 may include at least one master and at least one slave. When a master transmits a request to a slave, the slave may transmit, to the master, a response according to the request. The semiconductor IPs may be paired with each other, and a signal path may be formed for each of the various semiconductor IP pairs. Meanwhile, as the degree of integration and size of the system on chip 100 increase, the number (quantity) of semiconductor IPs included in the system on chip 100 increases, and accordingly, the number (quantity) of signal paths formed may increase, and power consumption may also increase. Accordingly, a semiconductor IP for transferring packets transmitted and received between a plurality of masters and a plurality of slaves may be required. In some example embodiments, the system on chip 100 may include first to N-th masters 110_1, 110_2, . . . , and 110_N, first to M-th slaves 120_1, 120_2, . . . , and 120_M, an interconnector 130, and a clock generator 140. N and M may be natural numbers greater than or equal to 1. The master and the slave are physical devices as semiconductor IPs, and the interconnector 130 is a physical device as semiconductor IPs that allow the master and the slave to communicate with each other.

The interconnector 130 may be connected between the first to N-th masters 110_1, 110_2, . . . , and 110_N and the first to M-th slaves 120_1, 120_2, . . . , and 120_M. The interconnector 130 may form a signal path between one master and one slave. For example, the first master 110_1 may transmit a request to the second slave 120_2 through a signal path, and the second slave 120_2 may transmit a response to the request to the first master 110_1 through the signal path. However, example embodiments are not limited to the example described above.

The interconnector 130 may be implemented as a bus to which a protocol having a predetermined standard bus specification is applied. For example, as a standard bus standard, the Advanced Microcontroller Bus Architecture (AMBA) protocol of Advanced RISC Machine (ARM) may be applied. Bus types of AMBA protocols may include Advanced High-Performance Bus (AHB), Advanced Peripheral Bus (APB), Advanced extensible Interface (AXI), and AXI Coherence Extensions (ACE). Among the bus types described above, AXI is an interface protocol between functional blocks and provides a multiple outstanding address function and a data interleaving function.

The clock generator 140 may generate a timing signal for use in synchronizing the operation of the circuit. In some example embodiments, the clock generator 140 may receive a root clock signal ROOT_CLK from an external source, generate an external clock signal CLK based on the root clock signal ROOT_CLK, and supply the external clock signal CLK to the first to N-th masters 110_1 to 110_N, the first to M-th slaves 120_2 to 120_M, and the interconnector 130.

Figure 2:
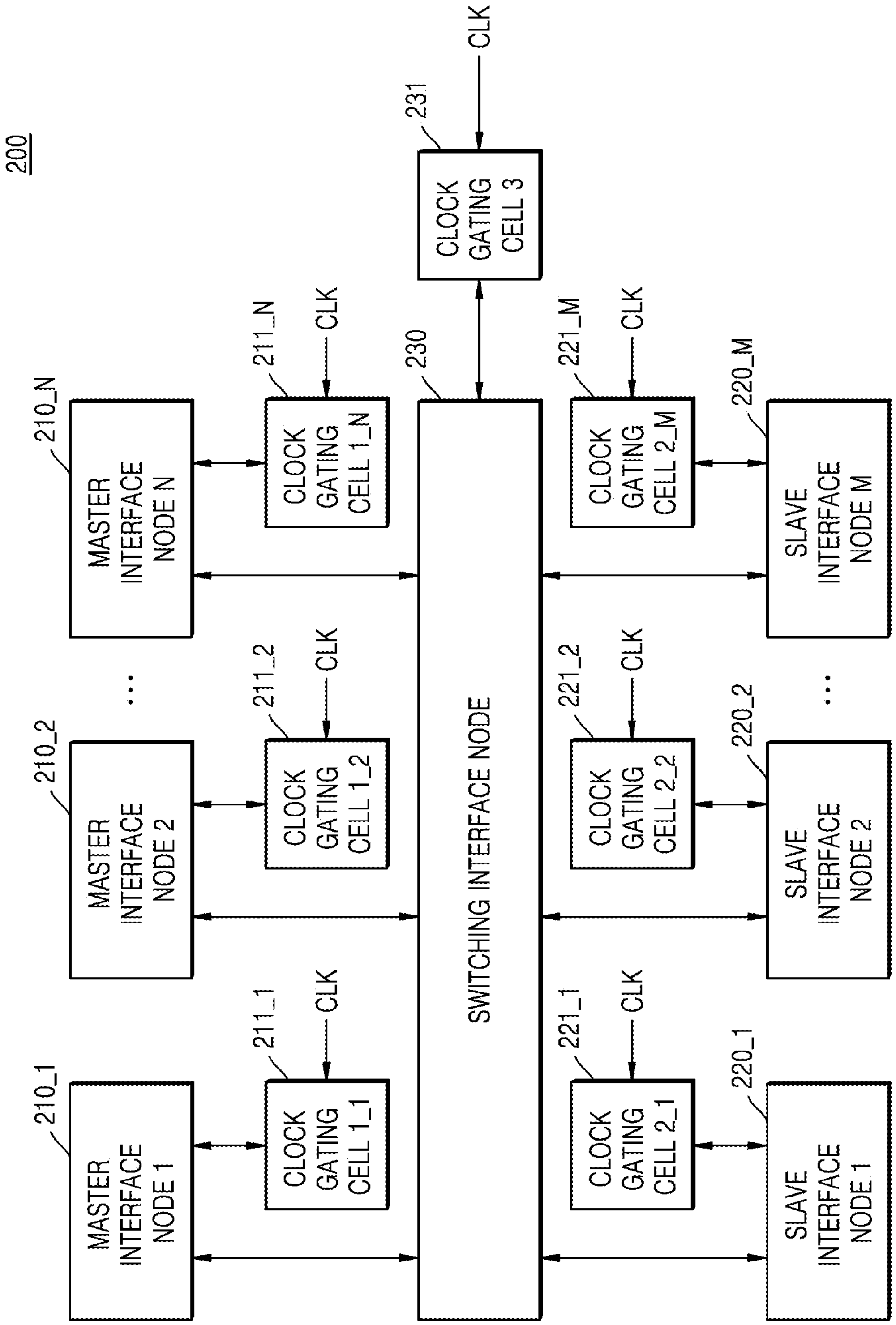
FIG. 2 is a block diagram of an interconnector according to some example embodiments of the present inventive concepts.

FIG. 2 is a block diagram of an interconnector 200 according to some example embodiments of the present inventive concepts. The interconnector 200 may implement the interconnector 130 of the system on chip 100 shown in FIG. 1.

Referring to FIGS. 1 and 2, the interconnector 200 may include first to N-th master interface nodes 210_1, 210_2, . . . , and 210_N, first to M-th slave interface nodes 220_1, 220_2, . . . , and 220_M, a switching interface node 230, and a plurality of clock gating cells 211_1 to 211_N, 221_1 to 221_M and 231. N and M may be natural numbers greater than or equal to 1.

The first to N-th master interface nodes 210_1, 210_2, . . . , and 210_N may be connected between the first to N-th masters 110_1, 110_2, . . . , and 110_N (as shown in FIG. 1) and the switching interface node 230. For example, the first master interface node 210_1 may be connected to the first master 110_1. The second master interface node 210_2 may be connected to the second master 110_2. Similarly, the N-th master interface node 210_N may be connected to the N-th master 110_N. The first to N-th master interface nodes 210_1, 210_2, . . . , and 210_N may output requests received from the first to N-th masters 110_1, 110_2, . . . , and 110_N to the switching interface node 230. In some example embodiments, the first to N-th master interface nodes 210_1, 210_2, . . . , and 210_N may output, to the first to N-th masters 110_1, 110_2, . . . , and 110_N, responses received from the switching interface node 230.

In some example embodiments, each master interface node may be configured to transmit and receive packets to and from a corresponding master based on a first clock signal, and may be configured to output ("transmit") a first control signal (also referred to herein as a first clock control signal) and a second control signal (also referred to herein as a second clock control signal) based on the packet. As referred to herein, outputting a signal may be referred to interchangeably as transmitting the signal. The first clock signal is a signal for synchronizing the operation of each of the master interface nodes, and may be generated by each of the first clock gating cells 211_1, 211_2, . . . , and 211_N. The first control signal may be a signal used to control an operation of each of the first clock gating cells 211_1, 211_2, . . . , and 211_N gating the first clock signal. The second control signal may be a signal used to control the operation of the third clock gating cell 231 gating the third clock signal while the request is transmitted. The packet may correspond to the request or may correspond to the response.

The first to M-th slave interface nodes 220_1, 220_2, . . . , and 220_M may be connected between the switching interface node 230 and the first to M-th slaves 120_1, 120_2, . . . , and 120_M. For example, the first slave interface node 220_1 may be connected to the first slave 120_1. The second slave interface node 220_2 may be connected to the second slave 120_2. Similarly, the M-th slave interface node 220_M may be connected to the M-th slave 120_M. The first to M-th slave interface nodes 220_1, 220_2, . . . , and 220_M may output requests from the switching interface node 230 to the first to M-th slaves 120_1, 120_2, . . . , and 120_M. In some example embodiments, the first to M-th slave interface nodes 220_1, 220_2, . . . , and 220_M may output, to the switching interface node 230, responses received from the first to M-th slaves 120_1, 120_2, . . . , and 120_M.

In some example embodiments, each slave node may be configured to transmit and receive a packet to and from a corresponding slave based on a second clock signal, and may be configured to output a first control signal and a third control signal based on the packet. The second clock signal is a signal for synchronizing the operation of each of the slave interface nodes, and may be generated by the second clock gating cells 221_1, 221_2, . . . , and 221_M. The first control signal may be a signal used to control an operation of each of the second clock gating cells 221_1, 221_2, . . . , and 221_M gating the second clock signal. The third control signal may be a signal used to control the operation of the third clock gating cell 231 gating the third clock signal while the response is transmitted.

The switching interface node 230 may generate signal paths between the first to N-th master interface nodes 210_1, 210_2, . . . , and 210_N and the first to M-th slave interface nodes 220_1, 220_2, . . . , and 220_M. For example, the switching interface node 230 may create a signal path between the second master interface node 210_2 and the M-th slave interface node 220_M, and packets (e.g., requests or responses) generated by the second master 110_2 and the M-th slave 120_M may be transmitted through the created signal path. However, example embodiments are not limited to the example of the signal path described above. The switching interface node 230 may include N×M type nodes for traffic routing and other modules.

In some example embodiments, the switching interface node 230 may be configured to transmit and receive a packet according to a signal path between one master interface node and one slave interface node based on a third clock signal, and may be configured to output a first control signal, a second control signal, and a third control signal based on the packet. The third clock signal is a signal for synchronizing the operation of the switching interface node 230, and may be generated by the third clock gating cell 231. The first control signal may be a signal used to control an operation of the third clock gating cell 231 gating the third clock signal. The second control signal may be a signal used to control an operation of each of the second clock gating cells 221_1 to 221_M gating the second clock signal. The third control signal may be a signal used to control an operation of each of the first clock gating cells 211_1 to 211_N gating the first clock signal.

The plurality of clock gating cells 211_1 to 211_N, 221_1 to 221_M, and 231 may generate timing signals for synchronizing the operation of the interface node based on the external clock signal CLK received from the outside.

In some example embodiments, the plurality of clock gating cells 211_1 to 211_N, 221_1 to 221_M, and 231 may be configured to gate the first clock signal based on the first control signal and the third control signal. In addition, the plurality of clock gating cells 211_1 to 211_N, 221_1 to 221_M, and 231 may be configured to gate the third clock signal based on the first control signal, the second control signal, and the third control signal. In addition, the plurality of clock gating cells 211_1 to 211_N, 221_1 to 221_M, and 231 may be configured to gate the second clock signal based on the first control signal and the second control signal.

In some example embodiments, the plurality of clock gating cells 211_1 to 211_N, 221_1 to 221_M, and 231 may include first to third clock gating cells.

The first clock gating cells 211_1 to 211_N may be configured to receive the first control signal from the first to N-th master interface nodes 210_1 to 210_N. In addition, the first clock gating cells 211_1 to 211_N may be configured to receive the third control signal from the switching interface node 230. In addition, the first clock gating cells 211_1 to 211_N may be configured to gate the first clock signal based on the first control signal and the third clock signal. The number (quantity) of first clock gating cells may be equal to the number (quantity) of master interface nodes.

The second clock gating cells 221_1 to 221_M may be configured to receive the first control signal from the first to M-th slave interface nodes 220_1, 220_2, . . . , and 220_M. In addition, the second clock gating cells 221_1 to 221_M may be configured to receive the second control signal from the switching interface node 230. In addition, the second clock gating cells 221_1 to 221_M may be configured to gate the second clock signal based on the first control signal and the second control signal. The number of second clock gating cells may be equal to the number of slave interface nodes.

The third clock gating cell 231 may be configured to receive the first control signal from the switching interface node 230. In addition, the third clock gating cell 231 may be configured to receive the second control signal from each of the first to N-th master interface nodes 210_1, 210_2, . . . , and 210_N. In addition, the third clock gating cell 231 may be configured to receive the third control signal from each of the first to M-th slave interface nodes 220_1, 220_2, . . . , and 220_M. In addition, the third clock gating cell 231 may be configured to gate the third clock signal based on the first control signal, the second control signal, and the third control signal.

Some example embodiments of the interface nodes 210_1 to 210_N, 220_1 to 220_M, and 230 and the plurality of clock gating cells 211_1 to 211_N, 221_1 to 221_M, and 231 will be described later with reference to FIGS. 3A to 3B, 4, 5A to 5B, 6 and 8.

Figure 3A:
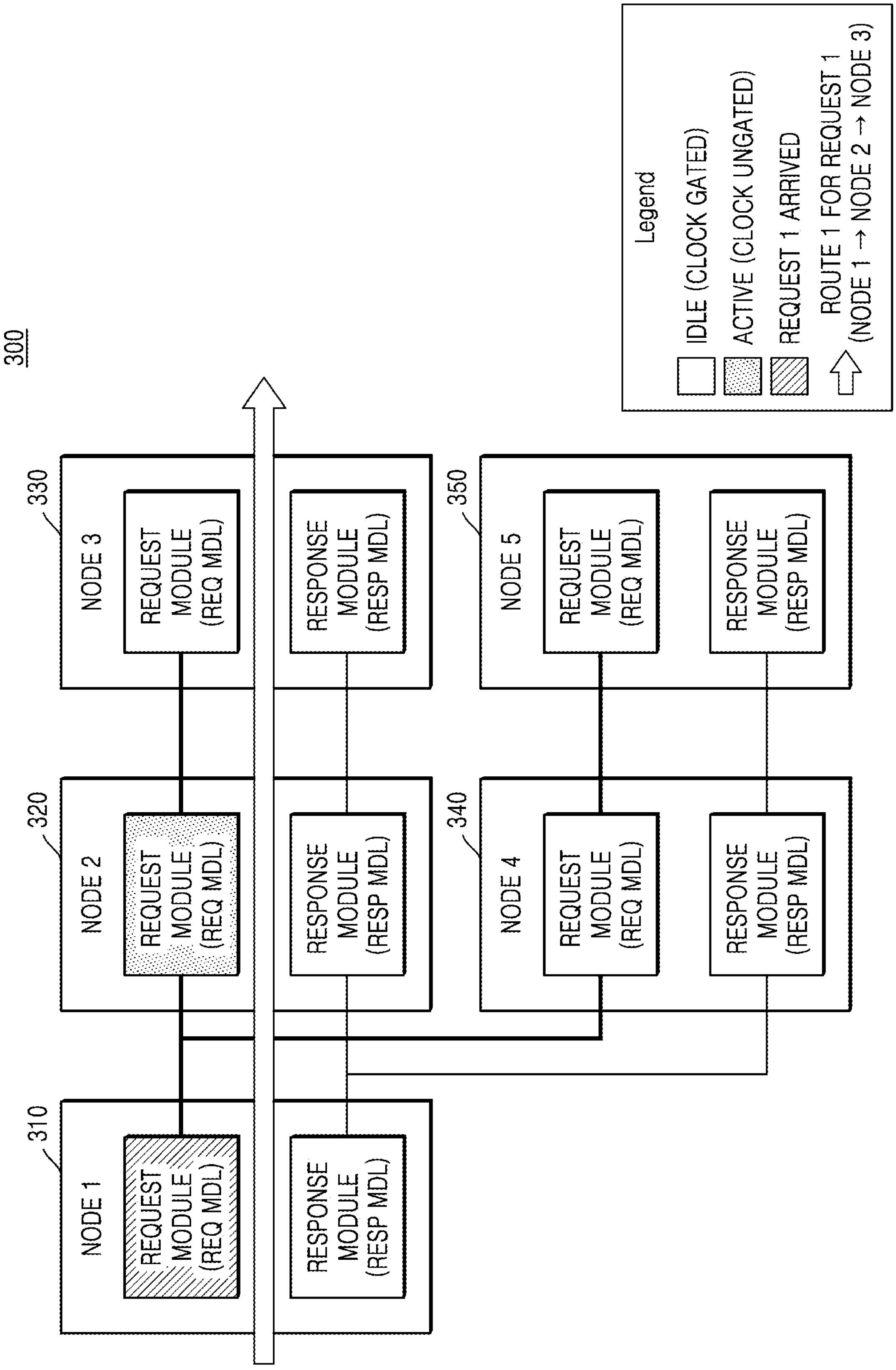
FIGS. 3A, 3B, and 3C are diagrams illustrating an example of a state of each node in a process of transmitting a request according to some example embodiments of the present inventive concepts.
Figure 3B:
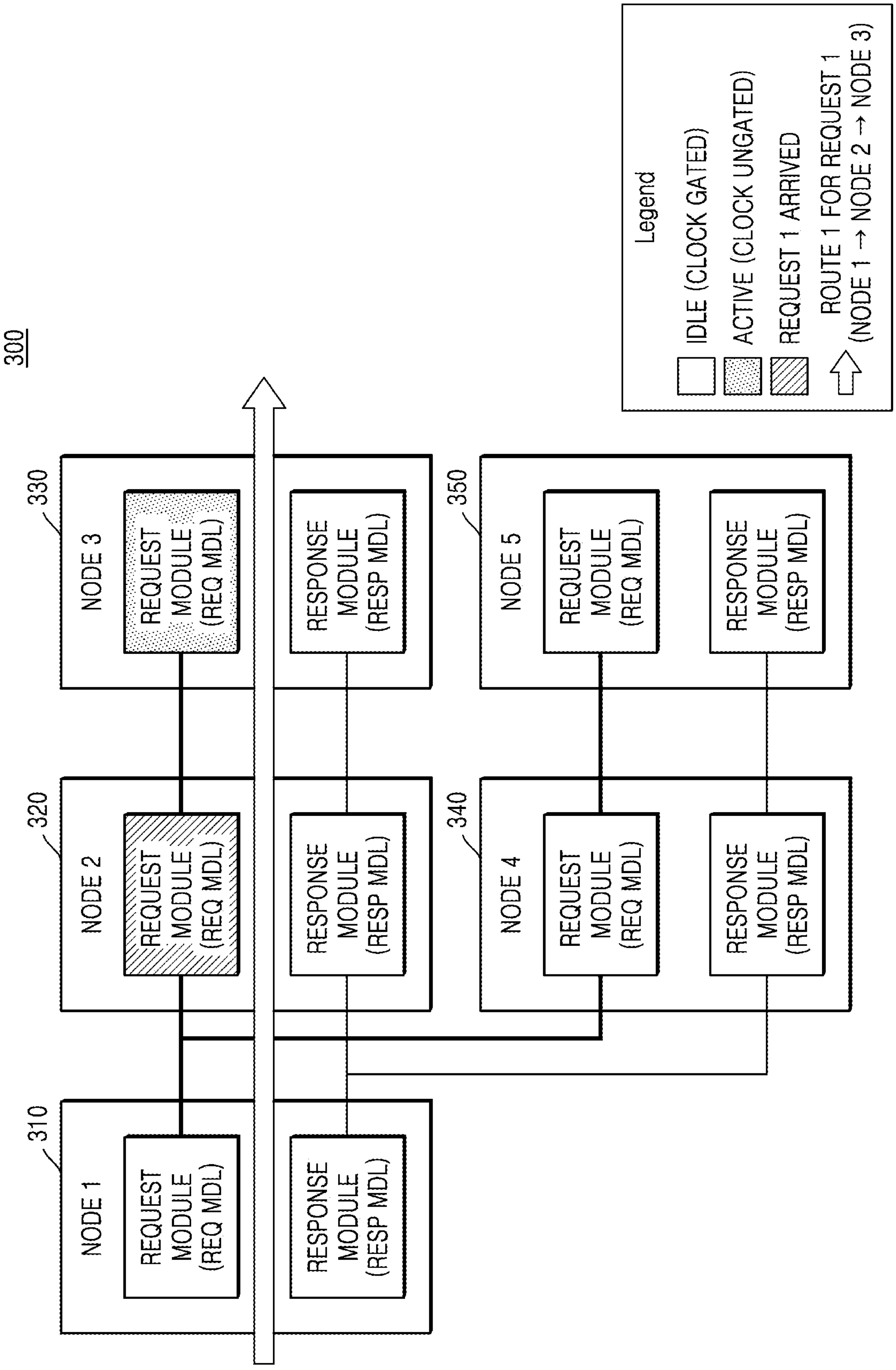
Figure 3C:
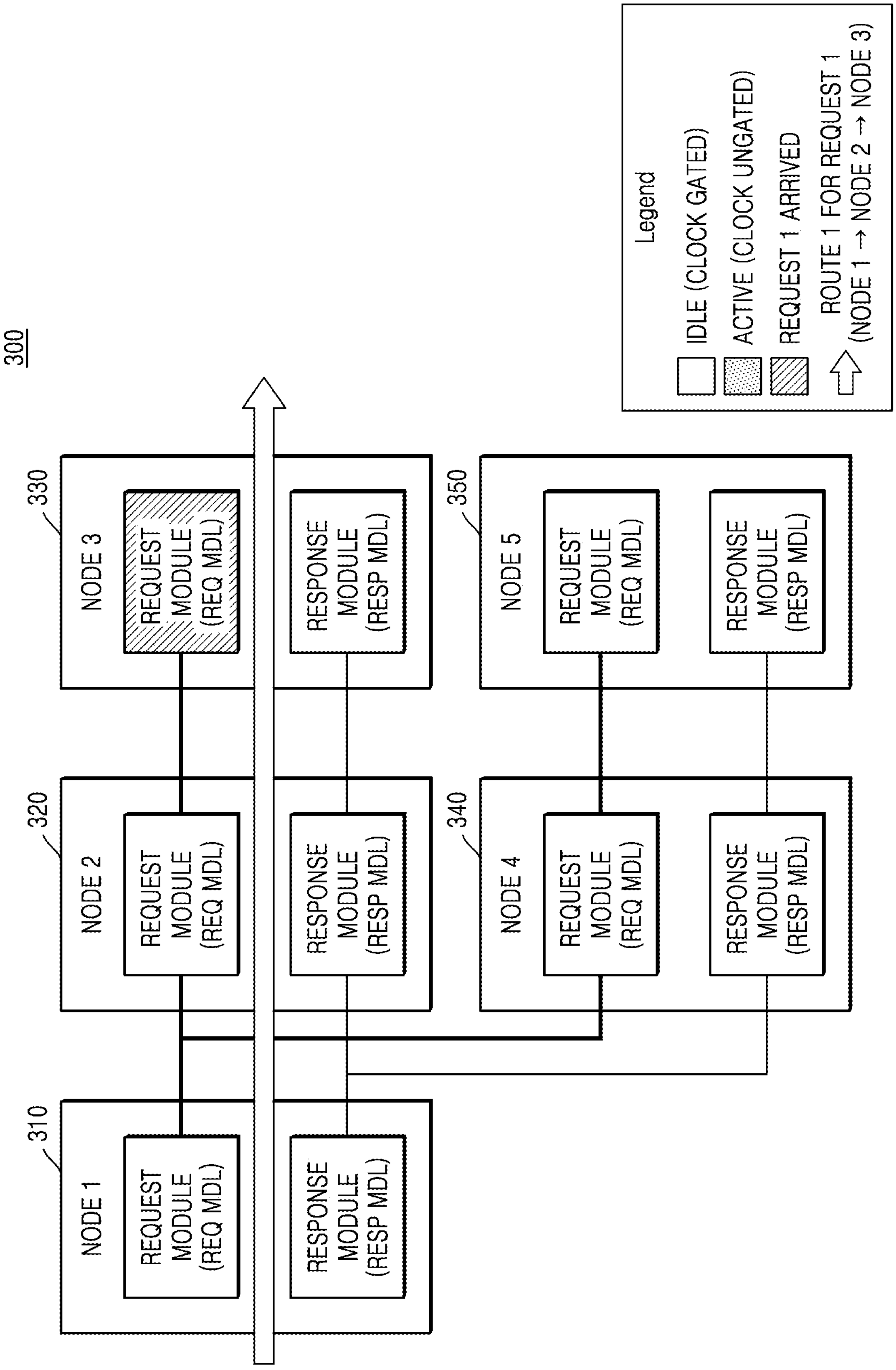

FIGS. 3A, 3B, and 3C are diagrams illustrating an example of a state of each node in a process of transmitting a request according to some example embodiments of the present inventive concepts.

Referring to FIGS. 3A, 3B, and 3C, a network on chip 300 may be included in the system on chip 100 of FIG. 1, and may include a plurality of nodes. The node may refer to a unit having an independent function inside the semiconductor IP, such as the interconnector 130, the network on chip 300, and the like.

For example, the network on chip 300 may include first to fifth nodes 310, 320, 330, 340, and 350. However, example embodiments are not limited to the example described above. Among the first to fifth nodes 310, 320, 330, 340, and 350, the first node 310 may correspond to a master interface node, the second and fourth nodes 320 and 340 may be included in switching interface node, and the third and fifth nodes 330 and 350 may correspond to slave interface nodes.

The first to fifth nodes 310, 320, 330, 340, and 350 may include a request module REQ MDL for transmitting a request and a response module RESP MDL for transmitting a response. The module may refer to a unit in which a node is responsible for a partial function for performing an independent function. A hierarchy of the system on chip 100 may be configured in the order of a block, a semiconductor IP, a node, and a module. Meanwhile, the node and the module may be the smallest unit performing a function role.

A signal path connected by wire may be formed between the first to fifth nodes 310, 320, 330, 340, and 350. For example, a signal path to which the request module REQ MDL is connected and a signal path to which the response module RESP MDL is connected may be formed between the first to third nodes 310, 320, and 330. A signal path to which the request module REQ MDL is connected and a signal path to which the response module RESP MDL is connected may be formed between the first, fourth, and fifth nodes 310, 340, and 350. However, example embodiments are not limited to the example described above. The first packet corresponding to the request may be transmitted from the master to the slave through the network on chip 300. In this case, the first packet may be transmitted along a specific signal path in the network on chip 300 according to the address included in the first packet. For example, the first request may be transmitted along a first signal path consisting of the first to third nodes 310, 320, and 330 (ROUTE 1 FOR REQUEST 1 of FIGS. 3A, 3B, and 3C). Hereinafter, it is assumed that the first request is transmitted along the first signal path, and that the fourth and fifth nodes 340 and 350 are in an idle state (IDLE of FIGS. 3A, 3B, and 3C).

Referring to FIG. 3A, in some example embodiments, when the first packet is transmitted from the master to the master interface node, the second clock signal provided to the slave interface node may be gated. For example, when the first request is transmitted from the master to the first node 310 (REQUEST 1 ARRIVED of FIG. 3A), the first clock signal may be provided to the first node 310 so that the first node 310 receives the first request from the master. The third clock signal may also be provided to the second node 320 adjacent to the first node 310 that stores the first request (ACTIVE of FIG. 3A). Meanwhile, the second clock signal provided to the third node 330 may be gated (IDLE of FIG. 3A).

Referring to FIG. 3B, in some example embodiments, when the first packet is transmitted from the master interface node to the switching interface node 230, the first clock signal provided to the master interface node may be gated. For example, when the first request is transmitted from the first node 310 to the second node 320 (REQUEST 1 ARRIVED of FIG. 3B), the first clock signal provided to the first node 310 may be gated (IDLE of FIG. 3B). In addition, the second clock signal may be provided to the third node 330 adjacent to the second node 320 (ACTIVE of FIG. 3B).

Referring to FIG. 3C, in some example embodiments, when the first packet is transmitted from the switching interface node 230 to the slave interface node, the first clock signal and the third clock signal provided to the master interface node and the switching interface node 230 may be gated. For example, when the first request is transmitted to the third node 330 (REQUEST 1 ARRIVED of FIG. 3C), the first and third clock signals provided to the first and second nodes 310 and 320 may be gated (IDLE of FIG. 3C).

According to some example embodiments described above, since the clock is provided only to modules actually required in the process of transmitting packets, power consumed by the system on chip 100 at low utilization may be saved. Accordingly, the power consumption efficiency of the system on chip 100 may be improved, and thus the functionality of the system on chip 100 may be improved.

Figure 4:
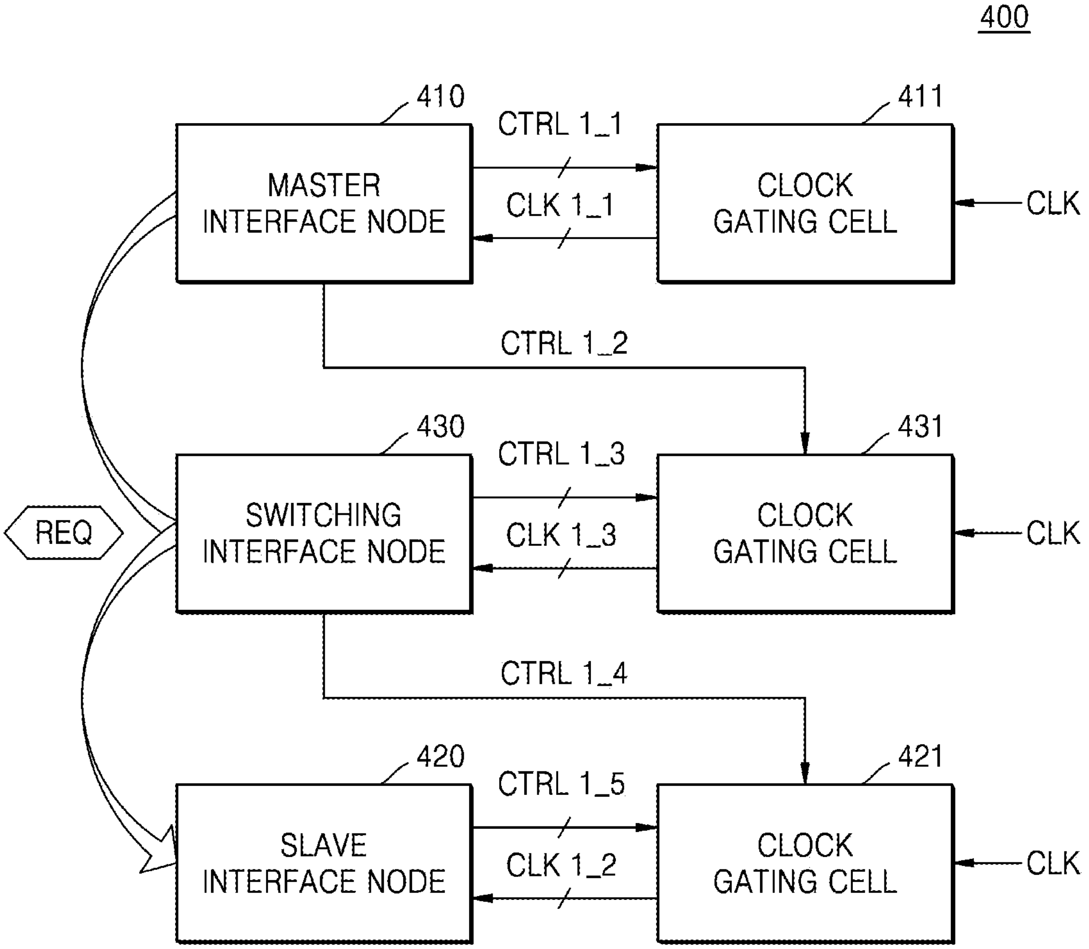
FIG. 4 is a block diagram illustrating an example of an interconnector transmitting a request according to some example embodiments of the present inventive concepts.

FIG. 4 is a block diagram illustrating an example of an interconnector 400 transmitting a request REQ according to some example embodiments of the present inventive concepts. The interconnector 400 may implement the interconnector 130 of the system on chip 100 shown in FIG. 1, the interconnector 200 shown in FIG. 2, or the like.

Referring to FIG. 4, the interconnector 400 may include a first interface node, a second interface node, and first and second clock gating cells. In some example embodiments, the interconnector 400 may correspond to the network on chip 300 of FIG. 3.

In some example embodiments, including a first embodiment, the first interface node may be the master interface node 410, the second interface node may be the switching interface node 430, the first clock gating cell may be the clock gating cell 411, and the second clock gating cell may be the clock gating cell 431. In some example embodiments, the first interface node may be the switching interface node 430, the second interface node may be the slave interface node 420, the first clock gating cell may be the clock gating cell 431, and the second clock gating cell may be the clock gating cell 421.

In some example embodiments, including a second embodiment, the first interface node may be the slave interface node 420, the second interface node may be the switching interface node 430, the first clock gating cell may be the clock gating cell 421, and the second clock gating cell may be the clock gating cell 431. In some example embodiments, the first interface node may be the switching interface node 430, the second interface node may be the master interface node 410, the first clock gating cell may be the clock gating cell 431, and the second clock gating cell may be the clock gating cell 411.

However, example embodiments are not limited to the example embodiments described above.

In some example embodiments, including the first embodiment, the first interface node may be configured to output ("transmit") a first clock control signal and a second clock control signal each having a first bit value, based on a first packet received from a first semiconductor IP. In addition, the first interface node may be configured to output the first packet based on the first clock signal. In addition, the first interface node may be configured to output a first clock control signal and a second clock control signal each having a second bit value, after transmission of the first packet is completed (e.g., based on completion of transmission of the first packet, in response to completion of transmission of the first packet, etc.).

For example, the first semiconductor IP may be a master. the master interface node 410 may handshake with the master. Handshaking may be performed based on a valid signal and a ready signal. The master interface node 410 may output control signals CTRL 1_1 and CTRL 1_2 having a first bit value, based on an address of a request REQ received from the master (e.g., the first semiconductor IP). The request REQ may correspond to the first packet. The control signal CTRL 1_1 may correspond to the first clock control signal, and the control signal CTRL 1_2 may correspond to the second clock control signal. The master interface node 410 may receive a request REQ from the master in synchronization with the clock signal CLK 1_1, store the request REQ therein, and output (transmit) the request REQ (e.g., first packet) stored therein (e.g., output the request REQ based on the clock signal CLK 1_1). When the internally stored request REQ is completely transmitted (e.g., based on and/or in response to a determination at the master interface node 410 that transmission, or outputting, of the request REQ, which may be the first packet, from the master interface node 410 is completed), the master interface node 410 may change the bit value of the control signals CTRL 1_1 and CTRL 1_2 from the first bit value to the second bit value. The master interface node 410 may then output ("transmit") the control signals CTRL 1_1 and CTRL 1_2 each having the second bit value.

As another example, the first semiconductor IP may be the master interface node 410. the switching interface node 430 may output control signals CTRL 1_3 and CTRL 1_4 each having a first bit value, based on the address of the request REQ received from the master interface node 410. The control signal CTRL 1_3 may correspond to the first clock control signal, and the control signal CTRL 1_4 may correspond to the second clock control signal. The switching interface node 430 may receive a request REQ from the master interface node 410 in synchronization with the clock signal CLK 1_3, store the request REQ therein, and output the request REQ stored therein. When the internally stored request REQ is completely transmitted (e.g., based on and/or in response to a determination at the switching interface node 430 that transmission, or outputting, of the request REQ, which may be the first packet, from the switching interface node 430 is completed), the switching interface node 430 may change the bit value of each of the control signals CTRL 1_3 and CTRL 1_4 from the first bit value to the second bit value.

In some example embodiments, including the first embodiment, the second interface node may be configured to output a third clock control signal having a first bit value in response to handshaking with the first interface node. In addition, the second interface node may be configured to receive the first packet from the first interface node based on the second clock signal.

For example, when the master interface node 410 is the first interface node, the switching interface node 430 may be the second interface node. When handshaking is performed with the master interface node 410 (e.g., in response to the handshaking), the switching interface node 430 may output the control signal CTRL 1_3 having the first bit value. The control signal CTRL 1_3 may correspond to the third clock control signal. The switching interface node 430 may receive the request REQ from the master interface node 410 in synchronization with (e.g., based on) the clock signal CLK 1_3 and store the request REQ therein. The switching interface node 430 may output the control signal CTRL 1_4 having the first bit value to the clock gating cell 421 based on the address of the request REQ.

As another example, when the switching interface node 430 is the first interface node, the slave interface node 420 may be the second interface node. The slave interface node 420 may output the control signal CTRL 1_5 having the first bit value in response to handshaking with the switching interface node 430. The control signal CTRL 1_5 may correspond to the third clock control signal. The slave interface node 420 may receive the request REQ from the switching interface node 430 in synchronization with the clock signal CLK 1_2, and store the request REQ therein.

In some example embodiments, including the first embodiment, the second interface node may be configured to output the first packet to the outside (e.g., an exterior of the second interface node, etc.) based on the second clock signal, and may be configured to output the third clock control signal having the second bit value after transmission of the first packet is completed (e.g., based on and/or in response to a determination at the switching interface node 430 that transmission, or outputting, of the first packet from the switching interface node 430 is completed).

For example, when the switching interface node 430 is the second interface node, the switching interface node 430 may determine the slave interface node 420 to transmit the request REQ based on the address included in the request REQ, and output the request REQ stored therein to the slave interface node 420 in synchronization with the clock signal CLK 1_3. Thereafter, the switching interface node 430 may change the bit value of each of the control signals CTRL 1_3 and CTRL 1_4 from the first bit value to the second bit value.

As another example, when the slave interface node 420 is the second interface node, the slave interface node 420 may output the request REQ stored therein to the corresponding slave in synchronization with the clock signal CLK 1_2. Thereafter, the slave interface node 420 may change the bit value of the control signal CTRL 1_5 from the first bit value to the second bit value.

In some example embodiments, including the first embodiment, the first clock gating cell may be configured to output the first clock signal based on the external clock signal CLK received from the outside (e.g., an external signal source that may be external to at least the first clock gating cell, for example the clock generator 140). In addition, the first clock gating cell may be configured to gate the first clock signal based on the first clock control signal.

For example, when the master interface node 410 is the first interface node, the clock gating cell 411 may be the first clock gating cell, the control signal CTRL 1_1 may correspond to the first clock control signal, and the clock signal CLK 1_1 may correspond to the first clock signal. As another example, when the switching interface node 430 is the first interface node, the clock gating cell 431 may be the first clock gating cell, and the clock signal CLK 1_3 may correspond to the first clock signal.

In some example embodiments, including the first embodiment, the second clock gating cell may be configured to output the second clock signal based on the external clock signal CLK. In addition, the second clock gating cell may be configured to gate the second clock signal based on both the second clock control signal and the third clock control signal.

For example, when the switching interface node 430 is the second interface node, the clock gating cell 431 may be the second clock gating cell, the clock signal CLK 1_3 may correspond to a second clock signal, the control signal CTRL 1_2 may correspond to the second clock control signal, and the control signal CTRL 1_3 may correspond to the third clock control signal.

As another example, when the slave interface node 420 is the second interface node, the clock gating cell 421 may be the second clock gating cell, the clock signal CLK 1_2 may correspond to the second clock signal, the control signal CTRL 1_4 may correspond to the second clock control signal, and the control signal CTRL 1_5 may correspond to the third clock control signal.

In some example embodiments, including the first embodiment, the first interface node may include a first request module configured to output the first clock control signal and the second clock control signal based on a request REQ corresponding to the first packet, and to output the request REQ to the second interface node based on the first clock signal. In addition, the second interface node may include a second request module configured to output the third clock control signal based on a request (REQ) received from the first request module and to output the request (REQ) based on the second clock signal. For example, the master interface node 410 may include the first request module, and the switching interface node 430 may include the second request module. As another example, the switching interface node 430 may include the first request module, and the slave interface node 420 may include the second request module.

Figure 5A:
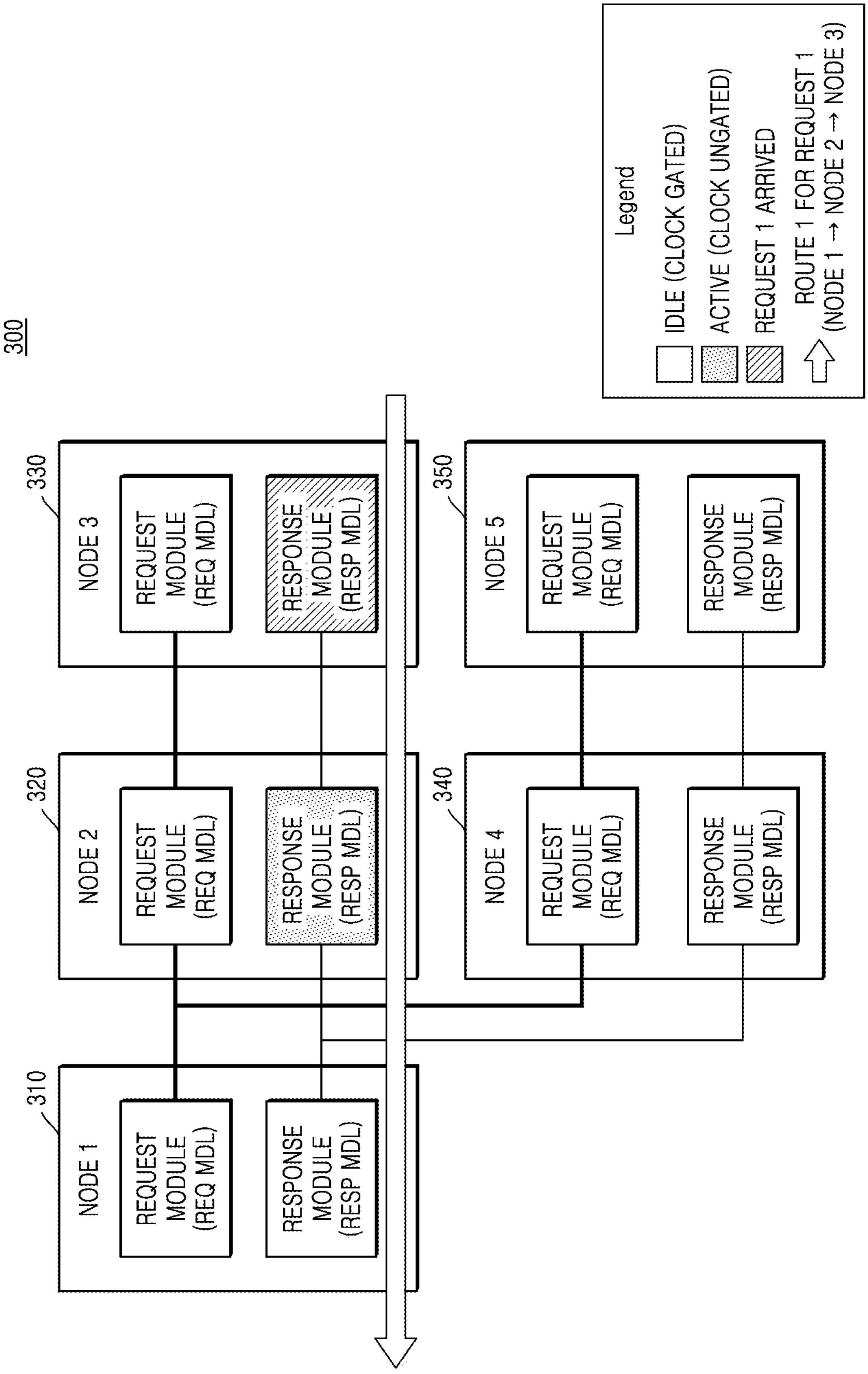
FIGS. 5A, 5B, and 5C are diagrams illustrating an example of a state of each node in a process of transmitting a response according to some example embodiments of the present inventive concepts.
Figure 5B:
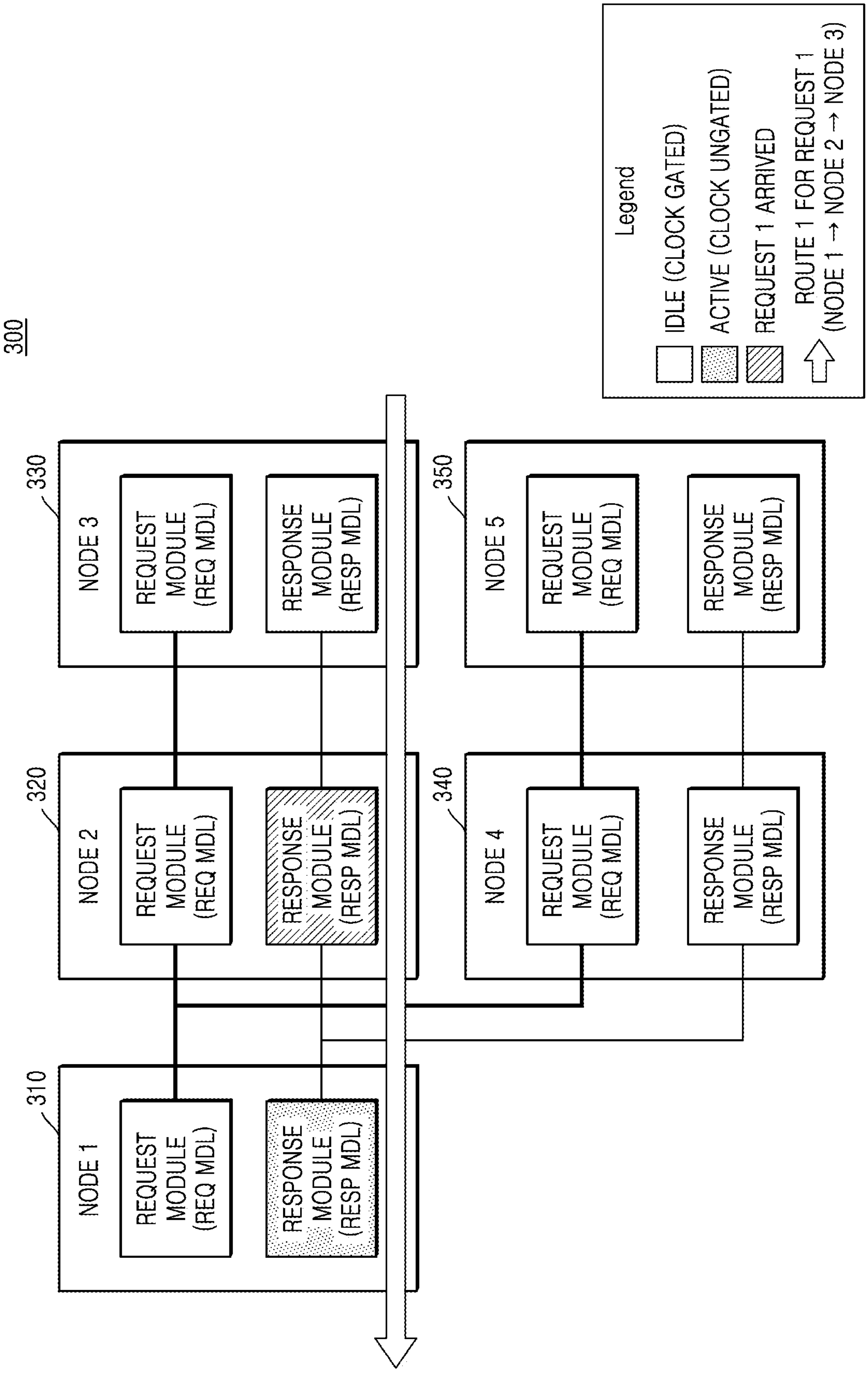
Figure 5C:
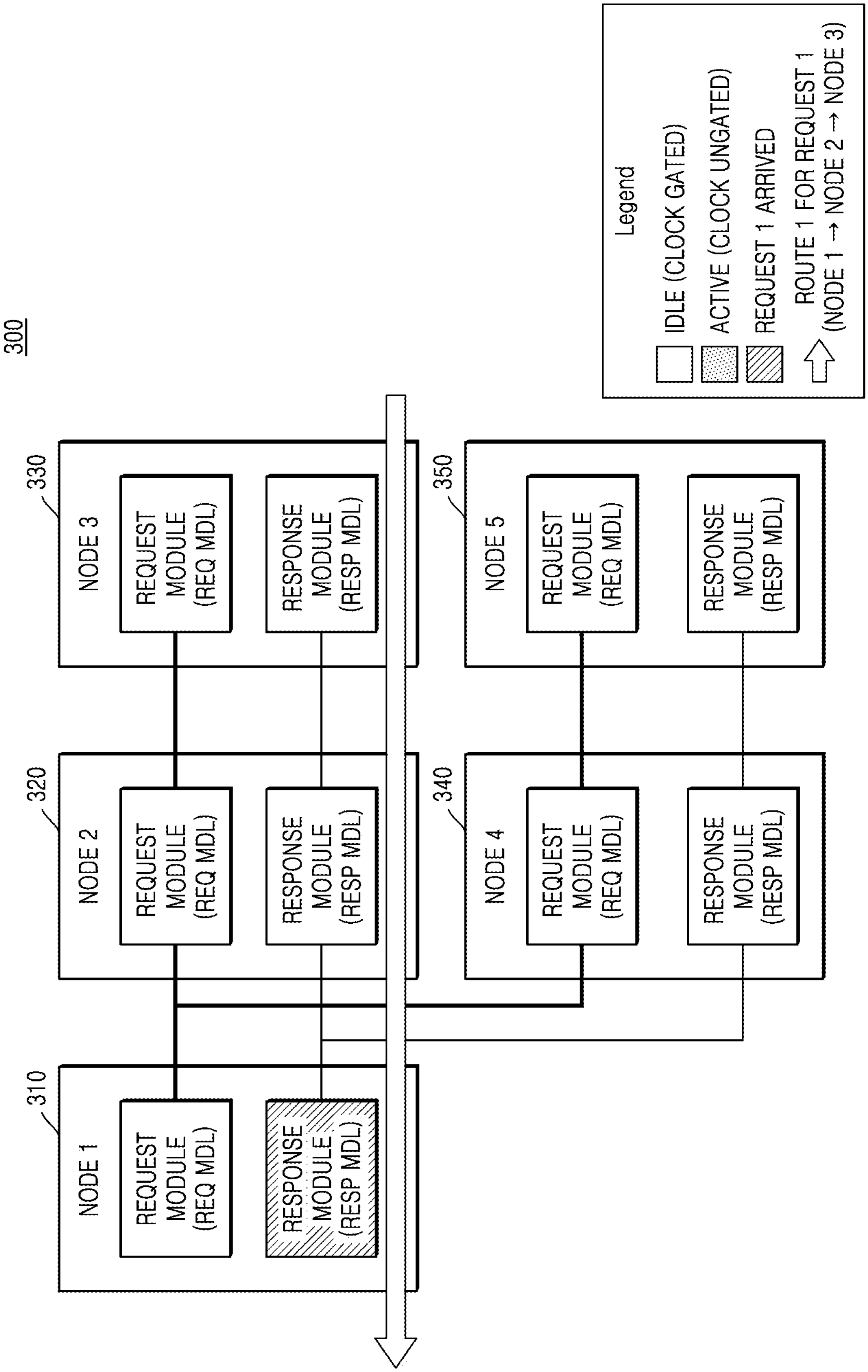

FIGS. 5A, 5B, and 5C are diagrams illustrating an example of a state of each node in a process of transmitting a response according to some example embodiments of the present inventive concepts. In FIGS. 5A, 5B, and 5C, descriptions of the same materials as those of the examples with reference to FIGS. 3A, 3B, and 3C will be omitted.

Referring to FIGS. 5A, 5B, and 5C, a response to the request described above with reference to FIGS. 3A, 3B, and 3C in the network on chip 300 may be transmitted along the same signal path (e.g., the first signal path) as that of the request (ROUTE 1 FOR REQUEST 1 of FIGS. 5A, 5B, and 5C). In some example embodiments, including the first embodiment, when (e.g., in response to a determination that) the second packet is transmitted from the slave to the slave interface node in response to the first packet, the first clock signal provided to the master interface node may be gated. When the second packet is transmitted from the slave interface node to the switching interface node 230, the second clock signal may be gated. When the second packet is transmitted from the switching interface node to the master interface node, the second clock signal and the third clock signal may be gated. That is, clock signals supplied to a node to which the first response arrives and a node adjacent to the node may be generated without being gated, and the clock signal supplied to a node not adjacent to the node to which the first response arrives may be gated. As described above, whenever the first response is sequentially transmitted to the next node, clock signals are provided to the corresponding node and the adjacent node, and clock signals provided to non-adjacent nodes may be gated. Referring to FIGS. 5A, 5B, and 5C, for example, after the second and third nodes 320 and 330 are activated, the first and second nodes 310 and 320 may be activated, and then the first node 310 may be activated.

According to some example embodiments described above, since the clock is provided only to modules actually required in the process of transmitting packets, power consumed by the system on chip 100 at low utilization may be saved. Accordingly, the power consumption efficiency of the system on chip 100 may be improved, and thus the functionality of the system on chip 100 may be improved.

Figure 6:
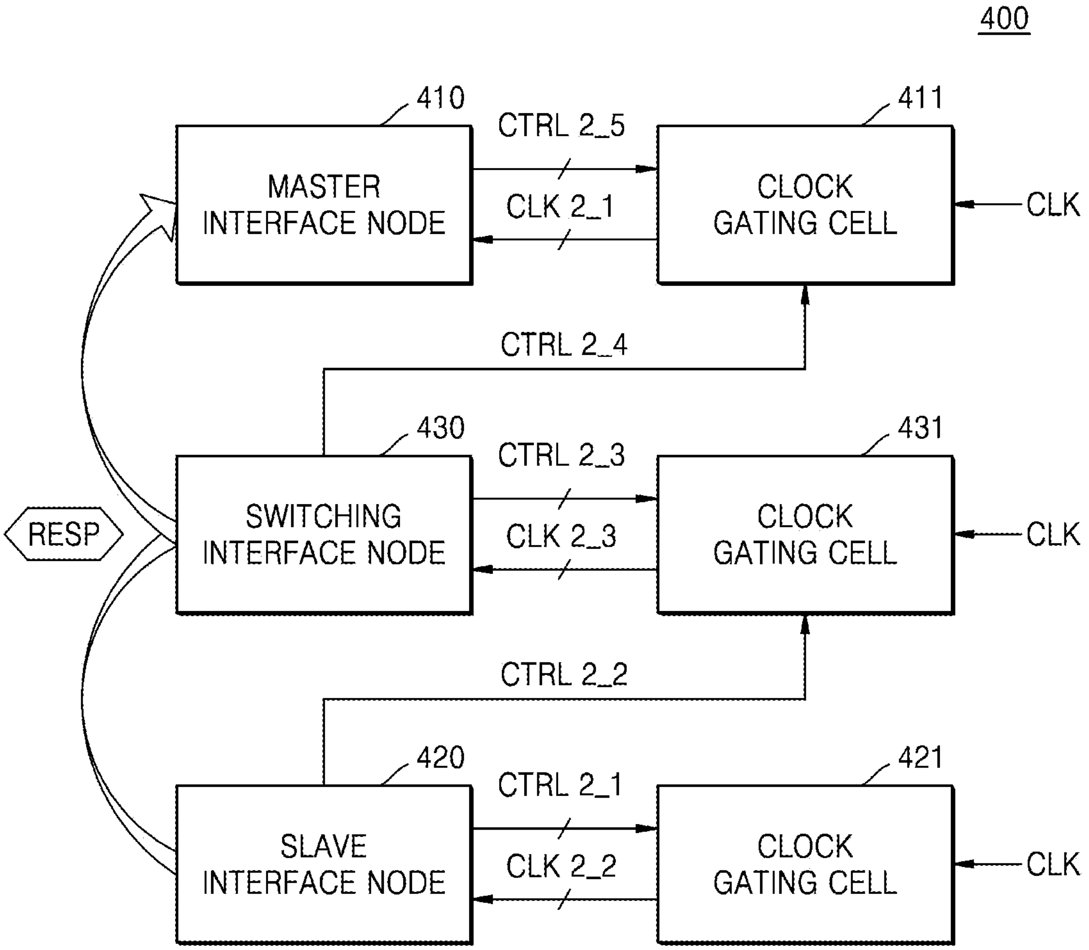
FIG. 6 is a block diagram illustrating an example of an interconnector transmitting a response according to some example embodiments of the present inventive concepts.

FIG. 6 is a block diagram illustrating an example of an interconnector 400 transmitting a response RESP according to some example embodiments of the present inventive concepts. The interconnector 400 may implement the interconnector 130 of the system on chip 100 shown in FIG. 1, the interconnector 200 shown in FIG. 2, or the like.

Referring to FIG. 6, the interconnector 400 may include a first interface node, a second interface node, and first and second clock gating cells. As described above with reference to FIG. 4, the first and second interface nodes according to some example embodiments, including the first embodiment, may be the master interface node 410 and the switching interface node 430, or the switching interface node 430 and the slave interface node 420, and the first and second interface nodes according to some example embodiments, including a second embodiment may be the slave interface node 420 and the switching interface node 430, or the switching interface node 430 and the master interface node 410. However, example embodiments are not limited to the example embodiments described above.

In some example embodiments, including the first embodiment, after the first packet is output from the second interface node to the outside (e.g., a signal recipient external to the second interface node, for example a third interface node, a slave interface node, or the like), the second interface node may be configured to receive a second packet corresponding to a response to the first packet from the outside (e.g., an external signal source that is external to the second interface node). The second interface node may be configured to output a third clock control signal and a fourth clock control signal each having a first bit value based on the second packet. In addition, the second interface node may be configured to output the second packet to the first interface node based on the second clock signal. In addition, the second interface node may be configured to output the third clock control signal and the fourth clock control signal each having a second bit value, after transmission of the second packet is completed. Meanwhile, the first clock gating cell may be configured to gate the first clock signal based on the first clock control signal and the fourth clock control signal.

For example, when the first interface node may be the switching interface node 430 and the second interface node may be the slave interface node 420, the slave interface node 420 may output the control signals CTRL 2_1 and CTRL 2_2 each having the first bit value based on the response RESP (which may correspond to the second packet) received from the slave. In this case, the control signal CTRL 2_1 may correspond to the third clock control signal, and the control signal CTRL 2_2 may correspond to the fourth clock control signal. The slave interface node 420 may output the response RESP to the switching interface node 430 in synchronization with (e.g., based on) the clock signal CLK 2_2. When the response RESP is transmitted to the switching interface node 430 (e.g., based on and/or in response to a determination at the slave interface node 420 that transmission, or outputting, of the response RESP, which may correspond to the second packet, from the slave interface node 420 is completed), the slave interface node 420 may change the bit value of each of the control signals CTRL 2_1 and CTRL 2_2 from the first bit value to the second bit value. The slave interface node 420 may then output ("transmit") the control signals CTRL 2_1 and CTRL 2_2 each having the second bit value. Meanwhile, the clock gating cell 431 may correspond to the first clock gating cell.

As another example, when the first interface node may be the master interface node 410 and the second interface node may be the switching interface node 430, the control signal CTRL 2_3 may correspond to the third clock control signal, and the control signal CTRL 2_4 may correspond to the fourth clock control signal. Meanwhile, the clock gating cell 411 may correspond to the first clock gating cell.

In some example embodiments, including the second embodiment, the first interface node may output first and second clock control signals each having a first bit value, based on the second packet received from the first semiconductor IP, output the second packet to the second interface node based on the first clock signal, and output first and second clock control signals each having a second bit value, after transmission of the second packet is completed.

For example, the first semiconductor IP may be a slave. the slave interface node 420 may output a control signal CTRL 2_1 having a first bit value in response to handshaking with the slave. The control signal CTRL 2_1 may correspond to the first clock control signal. The slave interface node 420 may receive a response RESP from the slave in synchronization with the clock signal CLK 2_2, store the response RESP therein, and output the response RESP stored therein. The slave interface node 420 may output the control signal CTRL 2_2 having the first bit value based on the response RESP. The control signal CTRL 2_2 may correspond to the second clock control signal. Next, the slave interface node 420 may change the bit value of each of the control signals CTRL 2_1 and CTRL 2_2 from the first bit value to the second bit value.

As another example, the first semiconductor IP may be the slave interface node 420. the switching interface node 430 may output the control signal CTRL 2_3 having the first bit value in response to handshaking with the slave interface node 420. The control signal CTRL 2_3 may correspond to the first clock control signal. The switching interface node 430 may determine the master interface node 410 to transmit the response RESP based on the response received from the slave interface node 420 and output the control signal CTRL 2_4 having the first bit value. The control signal CTRL 2_4 may correspond to the second clock control signal. The switching interface node 430 may receive a response RESP from the master interface node 410 in synchronization with the clock signal CLK 2_3, store the response RESP therein, and output the response RESP stored therein. When the internally stored response RESP is completely transmitted, the switching interface node 430 may change the bit value of each of the control signals CTRL 2_3 and CTRL 2_4 from the first bit value to the second bit value.

In some example embodiments, including the second embodiment, the second interface node may be configured to output a third clock control signal having a first bit value in response to handshaking with the first interface node. In addition, the second interface node may be configured to receive the second packet (i.e., response RESP) from the first interface node based on the second clock signal.

For example, when the slave interface node 420 is the first interface node, the switching interface node 430 may be the second interface node. In this case, the control signal 2_3 may correspond to the third clock control signal, and the clock signal CLK 2_3 may correspond to the second clock signal.

As another example, when the switching interface node 430 is the first interface node, the master interface node 410 may be the second interface node. In this case, the control signal 2_1 may correspond to the third clock control signal, and the clock signal CLK 2_1 may correspond to the second clock signal.

In some example embodiments, including the second embodiment, the second interface node may be configured to output the second packet to the outside based on the second clock signal, and may be configured to output the third clock control signal having the second bit value after transmission of the second packet is completed (e.g., based on and/or in response to a determination at the second interface node that transmission, or outputting, of the second packet from the second interface node is completed).

For example, when the switching interface node 430 is the second interface node, the switching interface node 430 may determine the master interface node 410 to transfer the response RESP based on the response RESP, and output the response RESP stored therein to the master interface node 410 in synchronization with (e.g., based on) the clock signal CLK 2_3. Thereafter, the switching interface node 430 may change the bit value of each of the control signals CTRL 2_3 and CTRL 2_4 from the first bit value to the second bit value.

As another example, when the master interface node 410 is the second interface node, the master interface node 410 may output the response RESP stored therein to the corresponding master in synchronization with the clock signal CLK 2_1. Thereafter, the master interface node 410 may change the bit value of the control signal CTRL 2_5 from the first bit value to the second bit value.

The first and second clock gating cells according to some example embodiments, including the first embodiment, may operate in the same manner as described above with reference to FIG. 4. The first and second clock gating cells according to some example embodiments, including the second embodiment, may operate similarly to those described above with reference to FIG. 4. For example, when the slave interface node 420 is the first interface node and the switching interface node 430 is the second interface node, the clock gating cell 421 may be the first clock gating cell and the clock gating cell 431 may be the second clock gating cell. As another example, when the switching interface node 430 is the first interface node and the master interface node 410 is the second interface node, the clock gating cell 431 may be the first clock gating cell and the clock gating cell 411 may be the second clock gating cell.

In some example embodiments, including the second embodiment, the first interface node may include a first response module configured to output a first clock control signal based on a response corresponding to the second packet, to output a second clock control signal having a second bit value, and to output a second packet to the outside based on the first clock signal. In addition, the second interface node may include a second response module configured to output a third clock control signal and a fourth clock control signal based on a second packet received from the outside and to output a response to the first response module based on the second clock signal.

Figure 7:
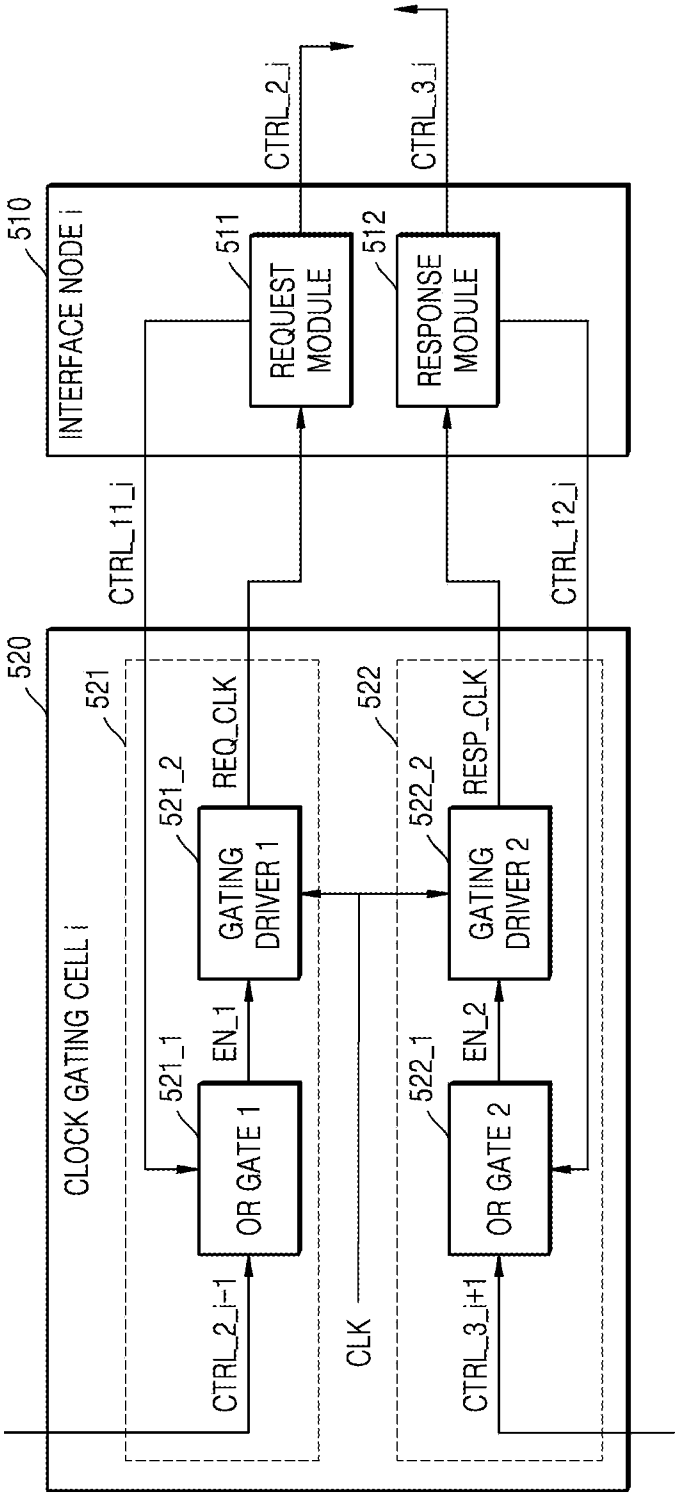
FIG. 7 is a block diagram of an interface node and a clock gating cell according to some example embodiments of the present inventive concepts.

FIG. 7 is a block diagram of an interface node 510 and a clock gating cell 520 according to some example embodiments of the present inventive concepts.

Referring to FIG. 7, an arbitrary interface node 510 (also referred to as an interface node I, where i may be any natural number) may include a request module 511 and a response module 512. The request module 511 is the same as described above with reference to FIGS. 3A, 3B, 3C, and 4. The response module 512 is the same as described above with reference to FIGS. 5A, 5B, 5C, and 6. When a request REQ is transmitted (e.g., in response to a determination at the interface node 510 that transmission of the request REQ from the interface node 510 is completed), the request module 511 may output a first control signal CTRL_11_*i* corresponding to a first clock control signal (or a third clock control signal) to a request module gating circuit 521, output a second control signal CTRL_2_*i* corresponding to a second clock control signal to an adjacent interface node, and the response module 512 may output a first control signal CTRL_12_*i* having a bit value (e.g., a second bit value) that is always deactivated or disabled to a response module gating circuit 522. Meanwhile, when a response RESP is transmitted, the request module 511 may output a first control signal CTRL_11_*i* having a bit value (e.g., a second bit value) that is always deactivated or disabled to the request module gating circuit 521, and the response module 512 may output a first control signal CTRL_12_*i* corresponding to the first clock control signal (or a third clock control signal) to the response module gating circuit 522, and may output a third control signal CTRL_3_*i* corresponding to the fourth clock control signal to an adjacent interface node.

In some example embodiments, when the interface node 510 is a master interface node, the request module 511 of the interface node 510 may be configured to receive the first packet from the master (e.g., the first master 110_1) as a request based on the first clock signal, may be configured to output the first control signal and the second control signal based on the first packet, and may be configured to output the first packet to the switching interface node based on the first clock signal. The response module 512 of the interface node 510 may be configured to receive the second packet as a response from the switching interface node based on the first clock signal, may be configured to output the first control signal based on the second packet, and may be configured to output the second packet to the master based on the first clock signal.

In some example embodiments, when the interface node 510 is a slave interface node, the request module 511 of the interface node 510 may be configured to receive the first packet as a request from the switching interface node based on the second clock signal, may be configured to output the first control signal based on the first packet, and may be configured to output the first packet to a slave (e.g., the first slave 120_1) based on the second clock signal. The response module 512 of the interface node 510 may be configured to receive a second packet as a response from a slave based on the second clock signal, output a first control signal and a third control signal based on the second packet, and output the second packet to the switching interface node based on the second clock signal.

In some example embodiments, when the interface node 510 is a switching interface node, the request module 511 of the interface node 510 may be configured to receive the first packet as a request from the master interface node (e.g., the first master interface node 210_1) based on the third clock signal, may be configured to output the first control signal and the second control signal based on the first packet, and may be configured to output the first packet to a slave interface node (e.g., a first slave interface node 220_1) based on the third clock signal. The response module 512 of the interface node 510 may be configured to receive the second packet as a response from a slave interface node (e.g., a first slave interface node 220_1) based on the third clock signal, to output the first control signal and the third control signal based on the second packet, and to output the second packet to the first master interface node based on the third clock signal.

An arbitrary clock gating cell 520 may include a request module gating circuit 521 and a response module gating circuit 522.

The request module gating circuit 521 may be configured to output the external clock signal CLK as a clock signal REQ_CLK to the request module 511 or to gate the clock signal REQ_CLK based on the first control signal CTRL_11_*i* and the second control signal CTRL_2_*i*−1. The second control signal CTRL_2_*i*−1 may be provided from an interface node (e.g., an (i−1)-th interface node) adjacent to an arbitrary interface node 510.

In some example embodiments, the request module gating circuit 521 may include a first OR operator 521_1 and a first gating driver 521_2. The first OR operator 521_1 may perform an OR operation of a bit value of the first control signal CTRL_11_*i* and a bit value of the second control signal CTRL_2_*i*−1. In some example embodiments, the first OR operator 521_1 may perform an OR operation on the bit value of the first clock control signal and the bit value of the fourth clock control signal. The first OR operator 521_1 may output, to the first gating driver 521_2, a first enable signal EN_1 having a logic value indicating a result of the OR operation. The first gating driver 521_2 may gate the external clock signal CLK received from the outside or output the external clock signal CLK as a clock signal REQ_CLK according to the logic value of the first enable signal EN_1.

In some example embodiments, a first clock gating cell may include a first request module gating circuit, and a second clock gating cell may include a second request module gating circuit. The first request module gating circuit may be configured to output the external clock signal CLK to a first request module as a first clock signal, and may be configured to gate the first clock signal based on the bit value of the first clock control signal. The second request module gating circuit may be configured to output the external clock signal CLK to a second request module as a second clock signal, and may be configured to gate the second clock signal based on a bit value of the second clock control signal and a bit value of the third clock control signal. The first and second clock signals of the first and second interface nodes may correspond to the clock signal REQ_CLK of each of the two adjacent interface nodes. Meanwhile, when the interface node 510 of FIG. 7 is a first interface node, the first clock control signal may correspond to the first control signal CTRL_11_*i*, the second clock control signal may correspond to the second control signal CTRL_2_*i*, and the third clock control signal may correspond to the first control signal of an interface node adjacent to the interface node 510 of FIG. 7. When the interface node 510 of FIG. 7 is the second interface node, the first clock control signal may correspond to the first control signal of the interface node adjacent to the interface node 510 of FIG. 7, the third clock control signal may correspond to the first control signal CTRL_11_*i*, and the second clock control signal may correspond to the second control signal CTRL_2_*i*−1.

Based on the first control signal CTRL_12_*i* and the third control signal CTRL_3_*i*+1, the response module gating circuit 522 may output, to the response module 512, the external clock signal CLK as the clock signal RESP_CLK or may gate the clock signal RESP_CLK. The third control signal CTRL_3_*i*+1 may be provided from an interface node (e.g., an (i+1)-th interface node) adjacent to an arbitrary interface node 510.

In some example embodiments, the response module gating circuit 522 may include a second OR operator 522_1 and a second gating driver 522_2. The second OR operator 522_1 may perform an OR operation of a bit value of the first control signal CTRL_12_*i* and a bit value of the third control signal CTRL_3_*i*+1. In some example embodiments, the second OR operator 522_1 may perform an OR operation of the bit value of the second clock control signal and the bit value of the third clock control signal. The second OR operator 522_1 may output, to a second gating driver 522_2, a second enable signal EN_2 having a logic value indicating a result of the OR operation. The second gating driver 522_2 may gate the external clock signal CLK or output the external clock signal CLK as a clock signal RESP_CLK according to the logic value of the second enable signal EN_2.

In some example embodiments, a first clock gating cell may include a first response module gating circuit, and a second clock gating cell may include a second response module gating circuit. The first response module gating circuit may be configured to output the external clock signal CLK to the first response module as the first clock signal, and may be configured to gate the first clock signal based on a bit value of the first clock control signal and a bit value of the fourth clock control signal. The second response module gating circuit may be configured to output the external clock signal CLK to the second response module as the second clock signal, and may be configured to gate the second clock signal based on the bit value of the third clock control signal. The first and second clock signals of the first and second interface nodes may correspond to the clock signal RESP_CLK of each of the two adjacent interface nodes. Meanwhile, when the interface node 510 of FIG. 7 is a first interface node, the first clock control signal may correspond to the first control signal CTRL_12_*i*, the third clock control signal may correspond to the first control signal of an interface node adjacent to the interface node 510 of FIG. 7, and the fourth clock control signal may correspond to the third control signal CTRL_3_*i*+1. When the interface node 510 of FIG. 7 is the second interface node, the first clock control signal may correspond to the first control signal of the interface node adjacent to the interface node 510 of FIG. 7, the third clock control signal may correspond to the first control signal CTRL_12_*i*, and the fourth clock control signal may correspond to the third control signal CTRL_3_*i*.

Figure 8:
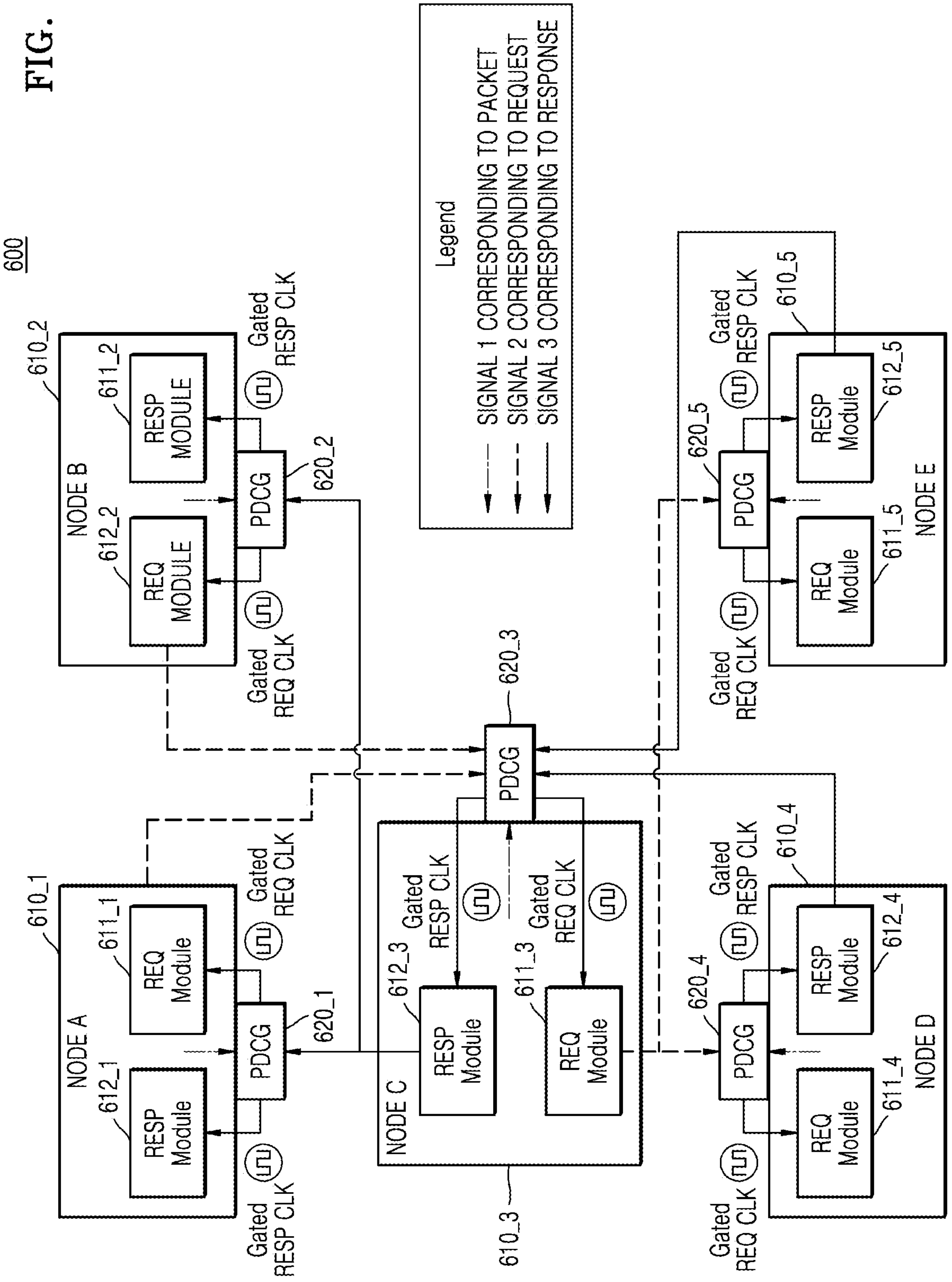
FIG. 8 is a block diagram illustrating an example of clock control signals provided to nodes according to some example embodiments of the present inventive concepts.

FIG. 8 is a block diagram illustrating an example of clock control signals provided to nodes according to some example embodiments of the present inventive concepts.

Referring to FIG. 8, a system on chip 600 may include a plurality of nodes 610_1 to 610_5 and a plurality of packet driven clock gating (PDCG) cells 620_1 to 620_5 responsible for each node. Although FIG. 8 shows that the number (quantity) of nodes is 5, example embodiments are not limited to that illustrated in FIG. 8. Each of a plurality of PDCG cells 620_1 to 620_5 may correspond to the clock gating cell described above. The number of PDCG cells may be equal to the number of nodes.

Due to the characteristics of the interconnect IP in the system on chip 600, traffic has a direction. For example, the direction of traffic may be divided into a direction in which the request is transmitted from the master to the slave and a direction in which the response is transmitted from the slave to the master. A direction in which the request is transmitted may be referred to as a forward direction, and a direction in which the response is transmitted may be referred to as a backward direction. When the direction of the traffic is the forward direction, first and second signals (SIGNAL 1 CORRESPONDING TO PACKET, and SIGNAL 2 CORRESPONDING TO REQUEST) corresponding to the request may be activated. When the direction of the traffic is the backward direction, first and third signals (SIGNAL 1 CORRESPONDING TO PACKET, and SIGNAL 3 CORRESPONDING TO RESPONSE) corresponding to the response may be activated.

The first signal SIGNAL 1 CORRESPONDING TO PACKET is a signal for indicating the activity of the node itself in charge, may be hardware-connected to only its own PDCG cell, and may be activated in an environment where the node in charge continues to require a clock signal. The second signal SIGNAL 2 CORRESPONDING TO REQUEST may be a signal for waking up (or activating) the request module of the node to receive the request after the node that has received the current request in the forward direction. The third signal SIGNAL 3 CORRESPONDING TO RESPONSE may be a signal for waking up the response module of the node to receive the response after the node receiving the current response in the backward direction.

Each of the plurality of PDCG cells 620_1 to 620_5 may perform a clock gating operation according to bit values of the first to third signals.

Based on the forward direction, for example, when a request for a read transaction is transmitted to the interconnect IP, the request module of the uppermost node (e.g., the request module 611_1 of node A 610_1 receiving the request) may change the bit value of the first signal 1 CORRESPONDING TO PACKET provided to the PDCG cell (e.g., 620_1) responsible for its own node from the second bit value (e.g., "0") to the first bit value (e.g., "1"). In addition, the request module (e.g., request module 611_1) may change the bit value of the second signal SIGNAL 2 CORRESPONDING TO REQUEST provided to the PDCG cell (e.g., 620_3) responsible for the node (e.g., node C 610_3) to receive a request next from the second bit value (e.g., "0") to the first bit value (e.g., "1"). Meanwhile, since another uppermost node (e.g., node B 610_2) that has not received the request may have an idle state, the first and second signals SIGNAL 1 CORRESPONDING TO PACKET and SIGNAL 2 CORRESPONDING TO REQUEST output by the corresponding node (e.g., node B 610_2) may be deactivated. For example, the first and second signals SIGNAL 1 CORRESPONDING TO PACKET and SIGNAL 2 CORRESPONDING TO REQUEST output by the node B 610_2 may have a second bit value. The PDCG cell (e.g., 620_1) may provide a clock signal REQ CLK to a request-related module (e.g., the request module 611_1) included in the uppermost node (e.g., the node A 610_1), and may gate the clock signal RESP CLK provided to other modules (e.g., the response module 612_1). When the transaction for the request passes through the uppermost node (e.g., node A 610_1) and is transmitted to the next node (e.g., node C 610_3), the clock signal REQ CLK provided to the uppermost node (e.g., node A 610_1) receiving the transaction for the first request may be gated. Meanwhile, the request module (e.g., 611_3) of the node (e.g., node C 610_3) may change the bit value of the first and second signals SIGNAL 1 CORRESPONDING TO PACKET and SIGNAL 2 CORRESPONDING TO REQUEST from the second bit value to the first bit value, similar to the above. In this case, the request module (e.g., 611_3) may recognize the path through which the request is transmitted by referring to the address included in the request. Accordingly, the request module (e.g., 611_3) may change the bit value of a signal applied to a wiring connected to the lowermost node to transmit the request based on the address. The bit value of the signal applied to the wiring connected to the PDCG cell of the lowermost node to transmit the request may be changed based on the address included in the request. For example, when a request to be transmitted to the node A 610_1, the node C 610_3, and the node D 610_4 is transmitted to the interconnect IP, the request module 611_3 of the node C 610_3 may change the bit value of the second signal 2 CORRESPONDING TO REQUEST applied to the wiring connected to the PDCG cell 620_4 responsible for the node D 610_4 from the second bit value to the first bit value. When the request is transmitted to the lowermost node (e.g., node D 610_4), nodes (e.g., node A 610_1 and node C 610_3) that previously received the request may be deactivated (or may have an idle state).

In the backward direction, adjacent nodes are activated in an order opposite to the forward direction, and bit values of the first and third signals SIGNAL 1 CORRESPONDING TO PACKET and SIGNAL 3 CORRESPONDING TO RESPONSE may be changed. For example, when a response to a request transmitted to the node A 610_1, the node C 610_3, and the node D 610_4 is transmitted to the interconnect IP, the response will be transmitted in the order of the node D 610_4, the node C 610_3, and the node A 610_1. Accordingly, only the node D 610_4 and the node C 610_3 are activated when the response is transmitted to the node D 610_4, only the node C 610_3 and the node A 610_1 are activated when the response is transmitted to the node C 610_3, and the node D 610_4 and the node C 610_3 may be deactivated when the response is transmitted to the A node 610_1.

In some example embodiments, each of the plurality of nodes 610_1 to 610_5 may correspond to an interface node of the interconnect IP, and among the plurality of nodes 610_1 to 610_5, node A 610_1 and node B 610_2 may be master interface nodes, node C 610_3 may be switching interface nodes, and node D 610_4 and node E 610_5 may be slave interface nodes. However, example embodiments are not limited to the example embodiments described above.

In some example embodiments, each of the plurality of nodes 610_1 to 610_5 is configured to transmit information between specific functional modules included in the semiconductor IP other than interconnect IP, and may correspond to a unit node configured to implement a specific functional behavior.

According to this transmission process, clock signals may be supplied to the node to receive the packet and the subordinate nodes in a timely manner, so that the system on chip 100 may handle clock gating coverage up to a node or module corresponding to the smallest function unit. Accordingly, it is possible to increase the efficiency of clock gating and reduce power consumption at low utilization, thereby improving power consumption efficiency, and thus improving functionality, of the system on chip 100.

Figure 9:
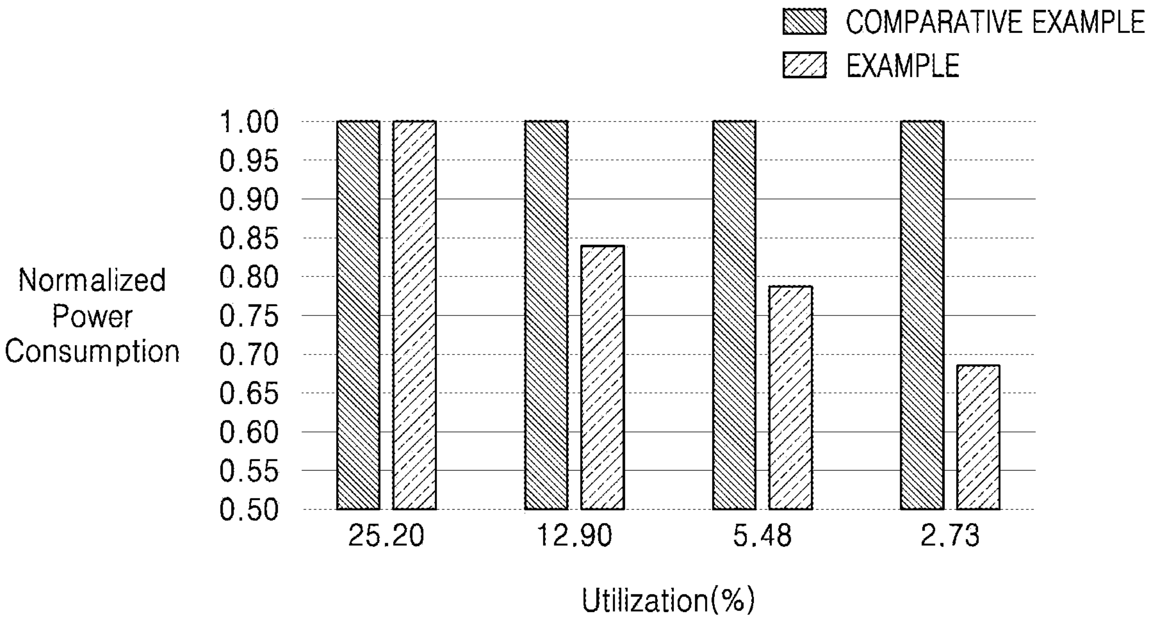
FIG. 9 is a graph illustrating power consumption of a system on chip according to utilization according to some example embodiments of the present inventive concepts.

FIG. 9 is a graph illustrating power consumption of a system on chip according to utilization according to some example embodiments of the present inventive concepts.

Referring to FIG. 9, the graph shown in FIG. 9 normalizes power consumption according to utilization in the system on chip 100 according to the comparative example ("COMPARATIVE EXAMPLE") and the system on chip 100 according to some example embodiments of the inventive concepts ("EXAMPLE"). The utilization may refer to the amount of information exchanged. In the system on chip 100 according to some example embodiments, clock signals may be provided only to modules actually required in a process of transmitting packets. According to this, as the utilization decreases, unnecessarily ungated nodes are gated, power consumption may be further reduced, and power consumption may be reduced at low utilization. In addition, because the area/timing overhead is very little, there is an effect of securing power gains without additional costs.

Figure 10:
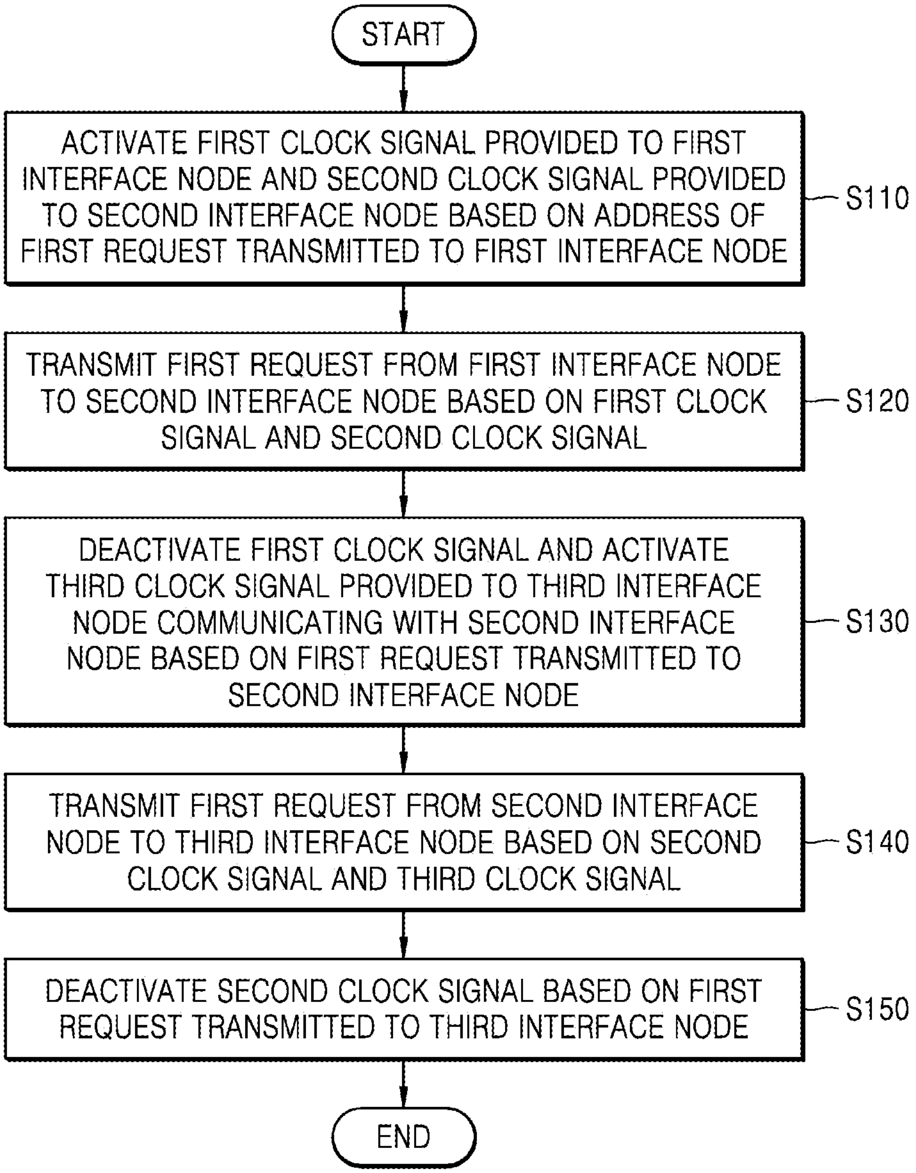
FIG. 10 is a flowchart illustrating an operating method of a system on chip according to some example embodiments of the present inventive concepts.

FIG. 10 is a flowchart illustrating an operating method of a system on chip according to some example embodiments of the present inventive concepts. The operations shown in FIG. 10, or any portion thereof, may be performed by a system on chip or any portion thereof according to any of the example embodiments, including for example the system on chip 100.

Referring to FIG. 10, in operation S110, the system on chip 100 may activate the first clock signal provided to the first interface node and the second clock signal provided to the second interface node communicating with the first interface, based on the address of the first request transmitted to the first interface node. Some example embodiments of operation S110 are the same as described above with reference to FIGS. 3A and 4.

In operation S120, the system on chip 100 may transmit the first request from the first interface node to the second interface node based on the first clock signal and the second clock signal. Some example embodiments of operation S120 are the same as described above with reference to FIGS. 3B and 4.

In operation S130, the system on chip 100 may deactivate the first clock signal based on the first request transmitted to the second interface node and activate the third clock signal provided to the third interface node communicating with the second interface node (e.g., based on a determination that the first request is transmitted to the second interface node). Some example embodiments of operation S120 are the same as described above with reference to FIGS. 3B and 4.

In operation S140, the system on chip 100 may transmit the first request from the second interface node to the third interface node based on the second clock signal and the third clock signal. Some example embodiments of operation S140 are the same as described above with reference to FIGS. 3C and 4.

In operation S150, the system on chip 100 may deactivate the second clock signal based on the first request transmitted to the third interface node. Some example embodiments of operation S150 are the same as described above with reference to FIGS. 3C and 4.

Figure 11:
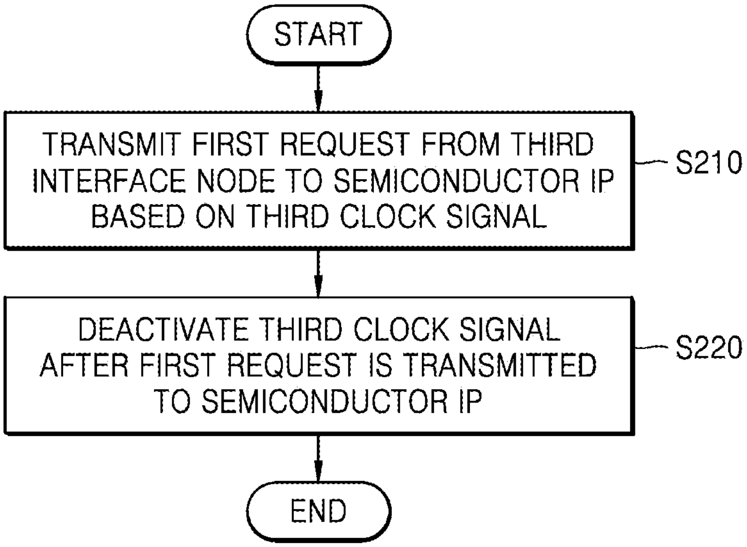
FIGS. 11, 12, and 13 are flowcharts illustrating the operating method of FIG. 10 according to some example embodiments of the present inventive concepts.
Figure 12:
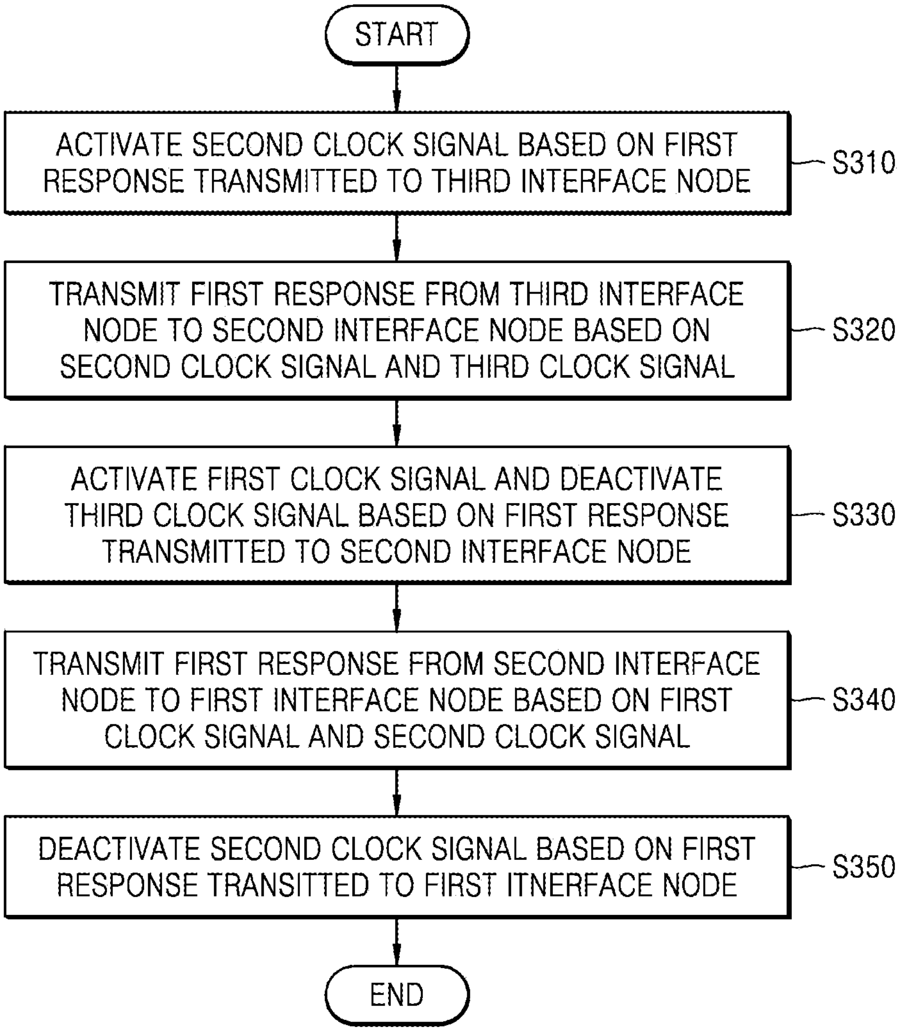
Figure 13:
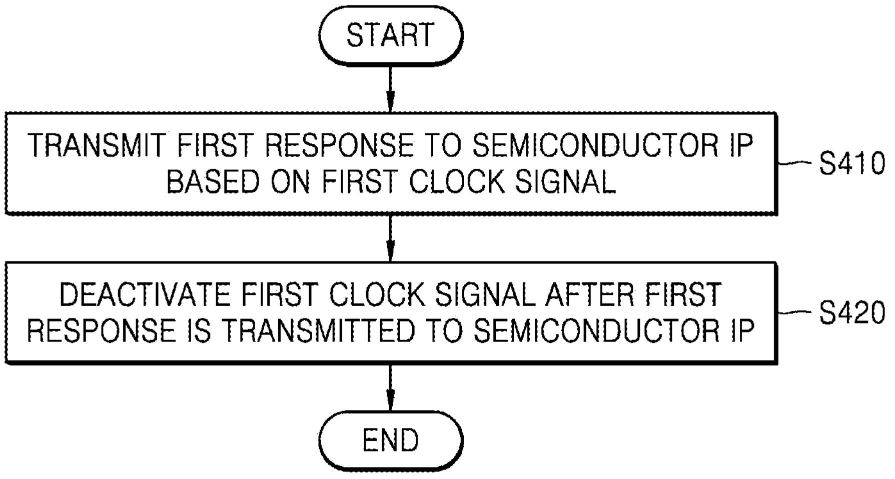

FIGS. 11, 12, and 13 are flowcharts illustrating the operating method of FIG. 10 according to some example embodiments of the present inventive concepts. The operations shown in FIGS. 11 to 13, or any portion thereof, may be performed by a system on chip or any portion thereof according to any of the example embodiments, including for example the system on chip 100.

Referring to FIG. 11, according to some example embodiments, the operating method of FIG. 10 may further include operations S210 and S220. In operation S210, the system on chip 100 may transmit the first request from the third interface node to the semiconductor IP based on the third clock signal. In operation S220, the system on chip 100 may deactivate the third clock signal after the first request is transmitted to the semiconductor IP (e.g., in response to a determination that transmission of the first request to the semiconductor IP is completed).

Referring to FIG. 12, in some example embodiments, the operating method of FIG. 10 may further include operation S310, operation S320, operation S330, operation S340, and operation S350. In operation S310, the system on chip 100 may activate the second clock signal based on the first response (or the response path) transmitted to the third interface node. In operation S320, the system on chip 100 may transmit the first response from the third interface node to the second interface node based on the second clock signal and the third clock signal. In operation S330, the system on chip 100 may activate the first clock signal and deactivate the third clock signal based on the first response transmitted to the second interface node. In operation S340, the system on chip 100 may transmit the first response from the second interface node to the first interface node based on the first clock signal and the second clock signal. In operation S350, the system on chip 100 may deactivate the second clock signal based on the first response transmitted to the first interface node.

Referring to FIGS. 12 and 13, the operating method of FIG. 10 according to some example embodiments may further include operations S410 and S420. In operation S410, the system on chip 100 may transmit the first response to the semiconductor IP based on the first clock signal. In operation S420, the system on chip 100 may deactivate the first clock signal after the first response is transmitted to the semiconductor IP (e.g., in response to a determination at the system on chip 100 that the transmission of the first response to the semiconductor IP is complete).

As described herein, any devices, systems, modules, portions, units, controllers, circuits, and/or portions thereof according to any of the example embodiments, and/or any portions thereof (including, without limitation, the system on chip 100, the first to N-th masters 110_1, 110_2, . . . , and 110_N, the first to M-th slaves 120_1, 120_2, . . . , and 120_M, the interconnector 130, the clock generator 140, the interconnector 200 the first to N-th master interface nodes 210_1, 210_2, . . . , and 210_N, the first to M-th slave interface nodes 220_1, 220_2, . . . , and 220_M, the switching interface node 230, the plurality of clock gating cells 211_1 to 211_N, 221_1 to 221_M and 231, the network on chip 300, the first to fifth nodes 310 to 350, the interconnector 400, the master interface node 410, the slave interface node 420, the switching interface node 430, the clock gating cell 411, the clock gating cell 431, the clock gating cell 421, the interface node 510, the request module 511, the response module 512, the clock gating cell 520, the request module gating circuit 521, the response module gating circuit 522, the system on chip 600, the plurality of nodes 610_1 to 610_5, the plurality of packet driven clock gating (PDCG) cells 620_1 to 620_5, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, portions, units, controllers, circuits, and/or portions thereof according to any of the example embodiments.

It is obvious to those skilled in the art that the structure of the inventive concepts may be variously modified or changed without departing from the scope or technical idea of the inventive concepts. In view of the foregoing, if modifications and changes of the present inventive concepts fall within the scope of the claims and equivalents below, it is believed that the present inventive concepts include variations and modifications of this inventive concepts.

While the inventive concepts have been particularly shown and described with reference to embodiments thereof, it will be understood that various changes in form and details may be made therein without departing from the spirit and scope of the following claims.

What is claimed is:

1. A system on chip, comprising:
a first interface node configured to
output a first clock control signal and a second clock control signal each having a first bit value, based on a first packet received from a first semiconductor Intellectual Property (IP),
output the first packet, based on a first clock signal, and
output the first clock control signal and the second clock control signal each having a second bit value, based on a determination that transmission of the first packet from the first interface node is completed;
a second interface node configured to
output a third clock control signal having the first bit value in response to handshaking with the first interface node, and
receive the first packet from the first interface node, based on a second clock signal;
a first clock gating cell configured to
output the first clock signal, based on an external clock signal received from an external signal source, the external signal source external to the first clock gating cell, and
gate the first clock signal, based on the first clock control signal; and
a second clock gating cell configured to
output the second clock signal, based on the external clock signal, and
gate the second clock signal, based on the second clock control signal and the third clock control signal.

2. The system on chip of claim 1, wherein the second interface node is configured to
output the first packet based on the second clock signal, and
output the third clock control signal having the second bit value based on a determination that transmission of the first packet from the second interface node is completed.

3. The system on chip of claim 2, wherein
the first interface node comprises a first request module configured to
output the first clock control signal and the second clock control signal, based on a request corresponding to the first packet, and
output the request to the second interface node, based on the first clock signal, and
the second interface node comprises a second request module configured to
output the third clock control signal, based on the request received from the first request module, and output the request, based on the second clock signal.

4. The system on chip of claim 3, wherein the first clock gating cell comprises a first request module gating circuit configured to output the external clock signal to the first request module as the first clock signal, and gate the first clock signal, based on a bit value of the first clock control signal, and the second clock gating cell comprises a second request module gating circuit configured to output the external clock signal to the second request module as the second clock signal, and gate the second clock signal, based on a bit value of the second clock control signal and a bit value of the third clock control signal.

5. The system on chip of claim 1, wherein the second interface node is configured to receive a second packet from an exterior of the second interface node as a response to the first packet, in response to the first packet being output from the second interface node, output the third clock control signal and a fourth clock control signal each having the first bit value, based on the second packet, output the second packet to the first interface node, based on the second clock signal, and output the third clock control signal and the fourth clock control signal each having the second bit value, in response to a determination that transmission of the second packet from the second interface node is completed, and the first clock gating cell is configured to gate the first clock signal, based on the first clock control signal and the fourth clock control signal.

6. The system on chip of claim 5, wherein the first interface node comprises a first response module configured to output the first clock control signal, based on a response corresponding to the second packet, output the second clock control signal having the second bit value, and output the second packet to an exterior of the first interface node, based on the first clock signal, and the second interface node comprises a second response module configured to output the third clock control signal and the fourth clock control signal, based on the second packet received from an exterior of the second interface node, and output the response to the first response module, based on the second clock signal.

7. The system on chip of claim 6, wherein the first clock gating cell comprises a first response module gating circuit configured to output the external clock signal to the first response module as the first clock signal, and gate the first clock signal, based on a bit value of the first clock control signal and a bit value of the fourth clock control signal, and the second clock gating cell comprises a second response module gating circuit configured to output the external clock signal to the second response module as the second clock signal, and gate the second clock signal, based on a bit value of the third clock control signal.

8. The system on chip of claim 5, wherein the first clock gating cell comprises:

a first OR operator configured to calculate a logic sum of a bit value of the first clock control signal and a bit value of the fourth clock control signal, and output a first enable signal having a logic value indicating a result of a first OR operation; and a first gating driver configured to gate the first clock signal or output the external clock signal as the first clock signal according to the logic value of the first enable signal; and the second clock gating cell comprises:

a second OR operator configured to calculate a logic sum of a bit value of the second clock control signal and a bit value of the third clock control signal, and output a second enable signal having a logic value indicating a result of a second OR operation; and a second gating driver configured to gate the second clock signal or output the external clock signal as the second clock signal according to the logic value of the second enable signal.

* * * * *